US010901932B2

(12) United States Patent
Purcell et al.

(10) Patent No.: US 10,901,932 B2
(45) Date of Patent: Jan. 26, 2021

(54) BACKPLANE INTERFACE SETS

(71) Applicant: HEWLETT PACKARD ENTERPRISE DEVELOPMENT LP, Houston, TX (US)

(72) Inventors: Brian T Purcell, Tomball, TX (US); David M Koonce, Cypress, TX (US); Barry L Olawsky, Houston, TX (US); Michael White, Houston, TX (US); Quoc Hung C Vu, Houston, TX (US); Kyran Wilfred Fey, Jr., Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 459 days.

(21) Appl. No.: 15/119,801

(22) PCT Filed: Apr. 23, 2014

(86) PCT No.: PCT/US2014/035109
§ 371 (c)(1),
(2) Date: Aug. 18, 2016

(87) PCT Pub. No.: WO2015/163865
PCT Pub. Date: Oct. 29, 2015

(65) Prior Publication Data
US 2017/0052919 A1  Feb. 23, 2017

(51) Int. Cl.
G06F 13/40  (2006.01)
H05K 7/14  (2006.01)

(52) U.S. Cl.
CPC ...... *G06F 13/4068* (2013.01); *G06F 13/4022* (2013.01); *H05K 7/1438* (2013.01)

(58) Field of Classification Search
None
See application file for complete search history.

(56) References Cited

U.S. PATENT DOCUMENTS 5,227,957 A    7/1993 Deters
6,426,952 B1 * 7/2002 Francis ............... H04L 12/56
                                                370/380

(Continued)

FOREIGN PATENT DOCUMENTS

EP    1700226    11/2007

OTHER PUBLICATIONS

International Searching Authority, The International Search Report and the Written Opinion, dated Dec. 30, 2014, 11 Pages.

Primary Examiner — Henry Tsai
Assistant Examiner — Christopher A Bartels
(74) Attorney, Agent, or Firm — Sheppard Mullin Richter & Hampton LLP

(57) ABSTRACT

An example device in accordance with an aspect of the present disclosure includes at least one interface set, including a first interface, at least one second interface, and at least one third interface. A first portion of the first interface is coupled to a second portion of the at least one second interface. A second portion of the first interface is coupled to a first portion of the at least one third interface. The first portion of the first interface is isolated from the second portion of the first interface, the first portion of the second interface is isolated from the second portion of the second interface, and the first portion of the third interface is isolated from the second portion of the third interface.

20 Claims, 10 Drawing Sheets

(56) References Cited

U.S. PATENT DOCUMENTS

| | | | |
|---|---|---|---|
| 7,013,084 B2 | 3/2006 | Battou et al. | |
| 7,170,241 B1* | 1/2007 | Faizullabhoy | H02P 25/06 |
| | | | 318/135 |
| 7,215,535 B2 | 5/2007 | Pereira | |
| 7,755,881 B2 | 7/2010 | Bottom et al. | |
| 7,843,692 B2 | 11/2010 | Everhart et al. | |
| 8,238,347 B2* | 8/2012 | DeSanti | H04L 61/6022 |
| | | | 370/395.5 |
| 8,363,388 B2 | 1/2013 | Wise et al. | |
| 8,441,793 B2 | 5/2013 | Dunwoody et al. | |
| 8,576,570 B2 | 11/2013 | Nguyen et al. | |
| 9,430,437 B1* | 8/2016 | Krishnan | G06F 13/4027 |
| 2003/0002656 A1 | 1/2003 | Schmokel | |
| 2004/0184249 A1 | 9/2004 | Aguinaga, Jr. et al. | |
| 2006/0126610 A1* | 6/2006 | Ryan | H04Q 3/68 |
| | | | 370/388 |
| 2009/0232446 A1* | 9/2009 | Nagy | G02B 6/29313 |
| | | | 385/18 |
| 2011/0055844 A1* | 3/2011 | Nguyen | G06F 1/189 |
| | | | 718/104 |
| 2012/0002378 A1 | 1/2012 | Wang et al. | |
| 2012/0243170 A1 | 9/2012 | Frink et al. | |
| 2013/0135811 A1 | 5/2013 | Dunwoody et al. | |
| 2014/0334084 A1* | 11/2014 | Fricker | H05K 1/14 |
| | | | 361/679.4 |
| 2015/0032928 A1* | 1/2015 | Andrews | G06F 13/4022 |
| | | | 710/300 |
| 2016/0007102 A1* | 1/2016 | Raza | H04L 49/356 |
| | | | 398/45 |
| 2017/0188074 A1* | 6/2017 | Mallett | G06F 13/4068 |

\* cited by examiner

BACKPLANE INTERFACE SETS

BACKGROUND

A computing system, such as a rack including a server and storage, may use external cabling to connect between servers and storage to define the physical associativity between the servers and/or storage. As servers or storage are added/removed/swapped, the physical cabling needs to be changed.

BRIEF DESCRIPTION OF THE DRAWINGS/FIGURES

DETAILED DESCRIPTION

Figure 1:
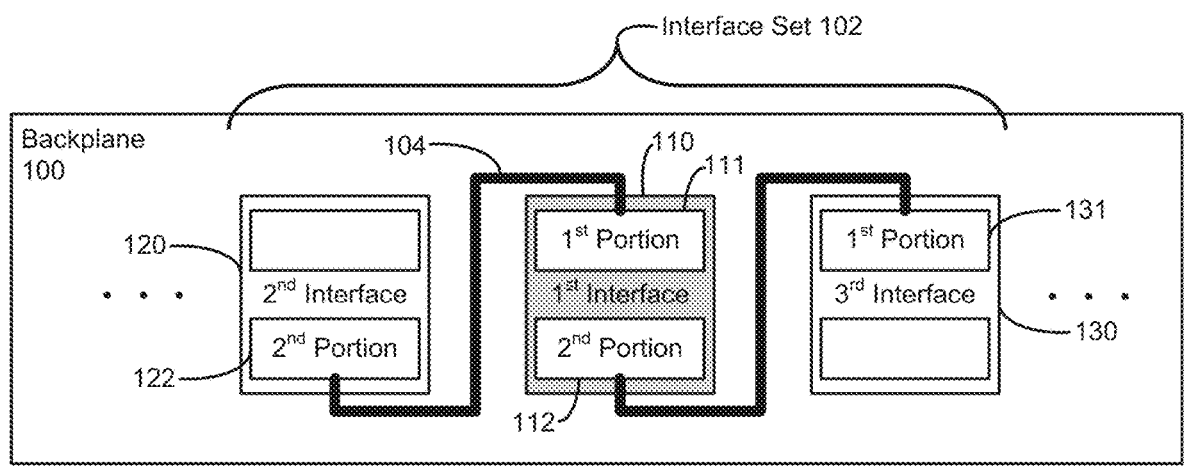
FIG. 1 is a block diagram of a backplane including an interface set according to an example.

Data center, cloud computing, and other computing-based environments may include individual dedicated server chassis, and rack-scale, enclosure-based solutions. An enclosure/chassis may house multiple server and/or storage modules, which may be in the form of removable blades/trays/sleds to interface with the enclosure. Enclosure-based systems may support multiple types of compute and storage modules, where the modules may have different form factors (such as spanning one or more chassis/enclosure bays/slots, commonly referred to as a rack/chassis unit "U", including 1U, 2U, and so on). Enclosure-based solutions offer the ability to reconfigure/refresh a datacenter quickly without having to disassemble and reassemble racks for different-sized servers and storage.

Enclosure-based solutions also offer a high degree of compute and storage density. However, highly dense solutions may be associated with space constraints for accommodating input/output (I/O) panels to connect components, which can lead to a restriction on the number, types, and bandwidth of fabrics that can be exposed out of a modular enclosure-based device (e.g. to connect out to a server, storage, other networking, etc.). Furthermore, using cabling to connect servers to networking and/or storage can lead to a significant amount of cables occupying space within the rack. The number of cables can complicate servicing modular components (e.g., servicing a server/compute module or storage module).

Examples provided herein can eliminate a need for such cabling as a customer touch point, and provide a clean, tool-free and cable-free servicing and installation experience. Furthermore, examples provided herein enable the mixing and matching of storage and compute/server modules within an enclosure/chassis, while enabling the modules to automatically connect with and communicate to one another across the backplane.

More specifically, a flexible and scalable storage backplane is described, supporting a mixture of storage and compute environments, with clean, tool-free and cable-free interfaces to the backplane. Modules, such as storage blades, may be coupled by the backplane to adjacent compute/storage modules, regardless of physical location within a chassis/enclosure, in a completely modular and (externally) cable-less manner. The number of storage modules/blades (e.g., just a bunch of discs (JBODs)) may be scaled to a compute module seamlessly, such that if more storage is needed at a compute node, another storage JBOD sled may be interfaced by the backplane to connect with the compute module or existing storage sleds/modules. In other words, modules may be interfaced at the infrastructure backplane based on direct connect or cascaded arrangements. Extra connectivity, such as an additional "fabric," may be provided by interfacing with the backplane without a need to consume front or rear panel space of the chassis. Accordingly, front and rear panel space may be conserved for use in connecting to things outside of the enclosure/chassis (e.g., to networking, Infiniband, external JBOD or other enclosures/modules, and so on). Because the backplane enables the storage fabric to be externally cable-less, examples may be used in both front-cabled and rear-cabled rack environments.

Examples provided herein enable storage modules/blades to be cascaded, regardless of the number of enclosure/chassis bays/slots that might be consumed by a given storage blade/module (e.g., 1U, 2U, 3U, eta). An example backplane can provide a connectivity solution for multiple compute modules/blades to share a common (set of) storage module(s)/blade(s), thereby enabling higher rack densities and minimizing a footprint of the chassis/rack/enclosure, Miscabling between storage modules and storage controllers/repeaters/bridges also may be eliminated by example backplanes that include, in the backplane, coupling between interfaces. Software-configurable backplane behavior is also supported, enabling various configuration options regarding how the backplane coupled interfaces with other interfaces and modules, and how modules will behave. A backplane may be configured to provide a default connection between interfaces/modules in one direction, based on cascading and/or direct connection. In an alternate example, a backplane may provide cascading in one direction based upon hardware strapping signals that are communicated through the backplane interfaces. Example backplanes may support communications in both directions, and assignment between modules may be determined based on negotiated assignments (e.g., whether a bay/slot is available, and/or whether bays/slots are reserved-right, reserved-left, allocated-right, and/or allocated-left). Scripted setup/configuration capability is also supported, for matching a storage device/location with a unique ID (such as a universally unique identifier (UUID)). Backplanes can support drive device/slot assignments that are stored in a non-volatile storage location, such as electrically erasable programmable read-only memory (EEPROM), on example devices, on a device infrastructure, and/or on a disaggregated management device.

FIG. 1 is a block diagram of a backplane 100 including an interface set 102 according to an example. The interface set 102 includes a first interface 110, at least one second interface 120, and at least one third interface 130. A coupling 104 is to couple a first portion 111 of the first interface 110 to a second portion 122 of the second interface(s) 120. A second portion 112 of the first interface 110 is coupled via a backplane coupling 104 to a first portion 131 of the third interface(s) 130.

The backplane 100 may include a plurality of interface sets 102. One interface set 102 is shown in FIG. 1. In an example, multiple interface sets 102 may be cascaded together to form the backplane 100. The backplane 100 is to interconnect with modules via the interfaces 110, 120, 130. The backplane 100 may provide a framework for multiple modules to connect into a common fabric (e.g., a storage fabric such as serial attached small computer system interface (SAS), serial advanced technology attachment (SATA), fabrics based on differential signaling or other point-to-point routable fabrics, including single-ended fabrics, differential fabrics, or optically-based fabrics. The fabric may accept various devices including compute, memory, network, storage, and/or other types of devices/modules. As used herein, references to fabrics may include a common fabric and/or a storage fabric or other types of fabrics. The term fabric may include a system of using a signal, or group/bus of signals, according to a type of bus technology to be used (such as SAS, PCI express (PCIe), or other technologies). The fabric may provide a point-to-point convention. Connectivity to the fabric may be electrical or optical, depending upon desired characteristics of signal integrity, bandwidth, physical media, or other solution criteria. The backplane 100 may provide the medium to passively and/or actively connect the fabric from one point (e.g., an interface portion) to another. The backplane 100 may be interfaced to be able to buffer or redrive or provide some level of switching for the fabric interface.

The backplane 100, and storage fabric provided by the backplane 100, may be mechanically organized and placed to support a modular architecture, compatible with a chassis-based multi-blade enclosure to receive a plurality of modules. This modular approach precludes the need for connecting external cables between a modular component and the storage fabric provided by the backplane 100, because a module can directly interact with the backplane 100 via the interfaces 110, 120, and 130. Accordingly, there is no need for a user/customer to manipulate cables to perform service and installation processes (e.g., perform a "rip and replace"). Cabling, if present, may be self-contained within the modular component(s) and/or the storage fabric backplane 100 interconnections, without a need for cabling between a module and its interface with the backplane 100.

An example logical interconnect arrangement may divide interface signals in half, and couple a first portion 111 of the signals from the upper half of the first interface 110, to a second portion 122 of the signals from the lower half of the second interface 120. Couplings 104 may provide appropriate transmit/receive (TX/RX) relationships when terminated at the first and second portions of the interfaces. The second portion 112 of the first interface 110 may couple signals from the lower half of the first interface 110 to the first portion 131 of the upper half of the third interface 130. Additional interconnect strategies may be used to minimize the effects of crosstalk between TX and RX channels, such as differential pairing, and other wiring and pin-out layouts. In an alternate example, the interface portions also may be provided as separate and distinct interfaces themselves, in addition to being provided as logical sub-portions of a single interface. Additionally, a portion may use more or less than half of an interface, including none or all of the signals of an interface. Similarly, when using separate interfaces for each portion, the interfaces may be equal or unequal regarding capacity for signals and pin-out couplings.

The backplane 100 may be formed as at least one printed circuit board (PCB). Multiple PCBs may be coupled together to form the backplane 100. In an example, a first PCB providing power interfaces may be coupled with a second PCB providing data interconnect boards to form the backplane 100, providing increased airflow by virtue of spacing/overlap between the multiple PCBs.

The coupling 104 is to provide communications between interfaces, and may be based on electrical signal paths such as PCB traces. In an example, the coupling 104 may be optical signal paths routed from one interface location to another (e.g., from one chassis slot to another). The coupling may remain optical between interfaces, such as in the case of a light pipe (or equivalent), and also may include a conversion between optical and electrical signals (e.g., based on a repeater or bridge functionality for an interface), such as using silicon photonics. Modular devices may interface to the storage fabric electrically and/or optically, e.g., may interface based on the type of interfaces 110, 120, 130 and/or based on the type of couplings 104.

A backplane coupling 104 may include one or more lanes of communication for a portion of an interface. A lane may be a number of signal paths used to connect one device to another. In an example, a lane may be a bus/interconnect based on a differential pair (that has two signals) extending between portions of an interface. The backplane 100 may be based on couplings 104 using multiple lanes, e.g., to effectively provide a wider bus having more connections between interfaces to effectively provide higher bandwidth between communication points. For example, coupling 104 may be based on PCIe x8/x16 lanes, to interface between x8 mini-SAS connectors, where an x8 coupling extends between adjacent interfaces, where each interface is formed by two mini-SAS connectors serving as first and second portions of an interface. The bandwidth supported by a coupling 104 may be chosen as a design decision; so that for a given interface/backplane design and desired bandwidth/throughput parameters, coupling 104 may be assigned a sufficient number of lanes according to a signaling rate of the bus type associated with the coupling 104. For an example SAS using a 6 Gigabit (Gb) transfer rate, a 12 Gb effective data rate may be achieved by using two lanes at 6 Gb each.

Interfaces 110, 120, 130 of the backplane 100 may be provided as one or more logical connectors to interface between the couplings 104 and modules to be interfaced with the backplane 100. In an example, an interface may be formed by two or more logical connectors, e.g., a portion (e.g., first portion 111) of the interface may be formed by a logical connector, of the plurality of logical connectors that form an interface. In an alternate example, an interface may be formed by one logical connector, where a subset of the pins/contacts of the connector are to correspond to a given first/second portions of the connector. Accordingly, a connector may be logically partitioned into two or more logical zones, and in each logical zone, a portion of the zone(s) may be routed by the backplane to the left and a portion may be routed to the right by couplings 104 to other interfaces. The one or more connectors of a given interface 110, 120, 130 may be provided by the backplane 100 at a bay/slot of a chassis/rack. A connector may be an off-the-shelf part, whose type and number for a given interface may be selected based on a number of signals to be passed through the interface, or other desired bandwidth capabilities to be supported. For example, an interface may be formed by one or more EdgeLine® connectors, SAS mezzanine connectors, 68-pin mini-SAS vertical connectors, Amphenol XCede® connector platforms, and so on.

The portions of an interface may be isolated from each other, based on the couplings 104 of the backplane 100 and the arrangement of the portions of an interface in relation to the backplane 100. As illustrated, the interfaces 110, 120, 130 do not include a coupling 104 between respective first and second portions of a given interface. Accordingly, a coupling path from one interface to the next may start at a portion of one interface, traverse a coupling 104, and terminate at another portion of another interface. Accordingly, in the example of FIG. 1, the backplane 100 does not provide an electrically continuous path across the entire backplane 100. Rather, the backplane 100 provides a plurality of couplings that may overlap at an interface. To traverse the entire backplane 100, a signal may traverse between portions of a given interface. Accordingly, whether a module is connected to both the first and second portions of an interface, and whether that module is capable of passing signals between its first and second portions, can determine whether a signal is allowed to traverse an interface. The modules may be configured accordingly, depending on desired signal paths. For example, a module may span a portion of a width of the backplane 100, corresponding to one or more interfaces. Accordingly, the module may receive signals from a portion of a first interface, and pass them to a portion of a different, possibly distant interface (e.g., another interface that is not immediately adjacent to the first interface). Thus, the backplane 100 supports the passing of signals along other routes (e.g., across a module) that may include portions of physically different and/or logically different interfaces.

Interfaces 110, 120, 130 may be physically spaced apart from each other to accommodate various widths of modules to be interfaced with the backplane 100. For example, two interfaces may be separated by a distance corresponding to a 1U module width. Accordingly, a 1U module may interface with one of the interfaces 110, 120, 130. Furthermore, a 2U module may be received at the backplane 100, by covering the width of two interfaces. Such a multi-width module (e.g., 2U or wider) may interface with two different interfaces (e.g., coupling to a first portion of one interface, and a second portion of another interface). Thus, interface coupling may be achieved between the backplane 100 and the module via adjacent or non-adjacent interfaces 110, 120, 130.

Thus, the backplane 100 provides the capability of connecting modules/blades to other modules (e.g., compute/storage), regardless of physical location within a common enclosure associated with the backplane 100. The interconnections are achievable by the backplane 100 based on a modular and (externally) cable-less approach, where storage and compute capabilities may automatically be extended/scaled by simply plugging additional modules into the backplane 100 as desired. Thus, serviceability and rack appearance/tidiness is improved, while eliminating a risk of incorrect cabling when components are changed. Storage/compute modules/blades may be cascaded, regardless of a width of the storage module and the number of chassis/enclosure slots that would be consumed by the module. The backplane 100 enables sharing of resources among modules, such as two compute modules sharing a common (set of) storage module(s). The backplane 100 enables various configuration options regarding behavior of signal flow across the backplane 100, such as default configuration options, software configurable options, directionality of signals being passed from interface to interface, cascading interfaces, directly connected interfaces, zoning/partitioning of modules connected to interfaces, sharing of module resources, automatic connections between server modules and storage modules (e.g., regardless of slot location or module width), and other characteristics. Configuration options may be based on hardware or software configurable settings for the backplane 100.

Figure 2:
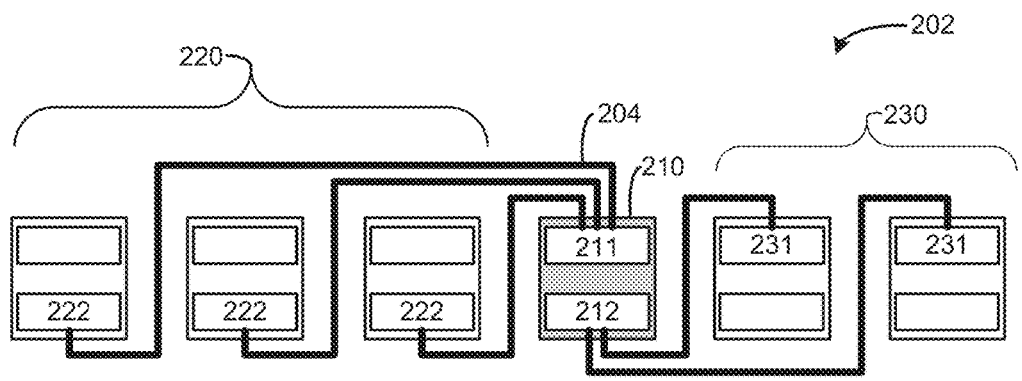
FIG. 2 is a block diagram of an interface set including a first interface, a plurality of second interfaces, and a plurality of third interfaces according to an example.

FIG. 2 is a block diagram of an interface set 202 including a first interface 210, a plurality of second interfaces 220, and a plurality of third interfaces 230 according to an example. Couplings 204 couple the first portion 211 of the first interface 210 to the second portions 222 of the second interfaces 220. Couplings 204 also couple the second portion 212 of the first interface 210 to first portions 231 of the third interfaces 230. A plurality of interface sets 202 may be repeated across a backplane.

Interface set 202 provides an example of directly connected interfaces, where a plurality of interfaces 220, 230 directly connect to the first interface 210. In other words, the interfaces are coupled to each other directly via couplings 204, without passing through an intervening interface having first and second isolated portions. Accordingly, the interfaces 220 and 230 of interface set 202 shown in FIG. 2 are not cascaded relative to the first interface 210, because communications may propagate directly from the first interface 210 to each of the second interfaces 220 and third interfaces 230. A coupling 204 may include a device along its directly connected path (which also applies to the coupling 104 of FIG. 1), such as a buffer, switch, redriving circuit, or other device. Such a device may strengthen signals passing along the coupling 204, and also may re-route signals to different interfaces/portions/destinations. Accordingly, directly connected interfaces may include other (e.g., non-interface) components along the coupling path between interfaces, and may route to other interfaces, without the directly coupled interfaces being isolated from each other.

The directly connected interface 210 of FIG. 2 provide at least two zones, e.g., a first zone associated with the second interfaces 220, and a second zone associated with the third interfaces 230. The groups of directly connected interfaces also may be divided further into additional zones, e.g., based on a module at interface 210 and its interaction with and control over the couplings 204. A computer/server module may be associated with interface 210, enabling directly connected/attached storage to be added to the other interfaces for direct connection to the server module, without needing to cascade through intermediate connectors/interfaces. Accordingly, the directly connected arrangement of a backplane based on the interface set 202 provides a much flatter topology, compared to a daisy chained arrangement of interfaces, enabling lower latency communications. The arrangement of the example shown in FIG. 2 is asymmetrical and includes three couplings 204 to the left, and two couplings 204 to the right. However, the first interface 210 may be symmetrical, and may be coupled to one or more interfaces to the left and/or right, and may include a corresponding number of lanes that are partitioned off to the various interfaces accordingly. A single first portion 211 of the first interface 210 is shown having different segments (couplings 204) branching off. In an alternate example, the first interface 210 may have a plurality of first portions 211 (and/or second portions 212) having corresponding couplings 204 (e.g., a plurality of connectors for a portion, corresponding to different lanes/couplings). The number of couplings/interfaces/portions may be tailored to accommodate design parameters. In an example, there may be a higher throughput demand associated with interfaces to the left of the first interface 210, resulting in a correspondingly greater number of signals coupled to the left, in contrast to the right, having the flexibility to correspond to bandwidth and connectivity needs. Other balancing factors may be taken into account in the design/layout/switching capabilities of the backplane based on interface sets, such as interface set 202.

Figure 3:
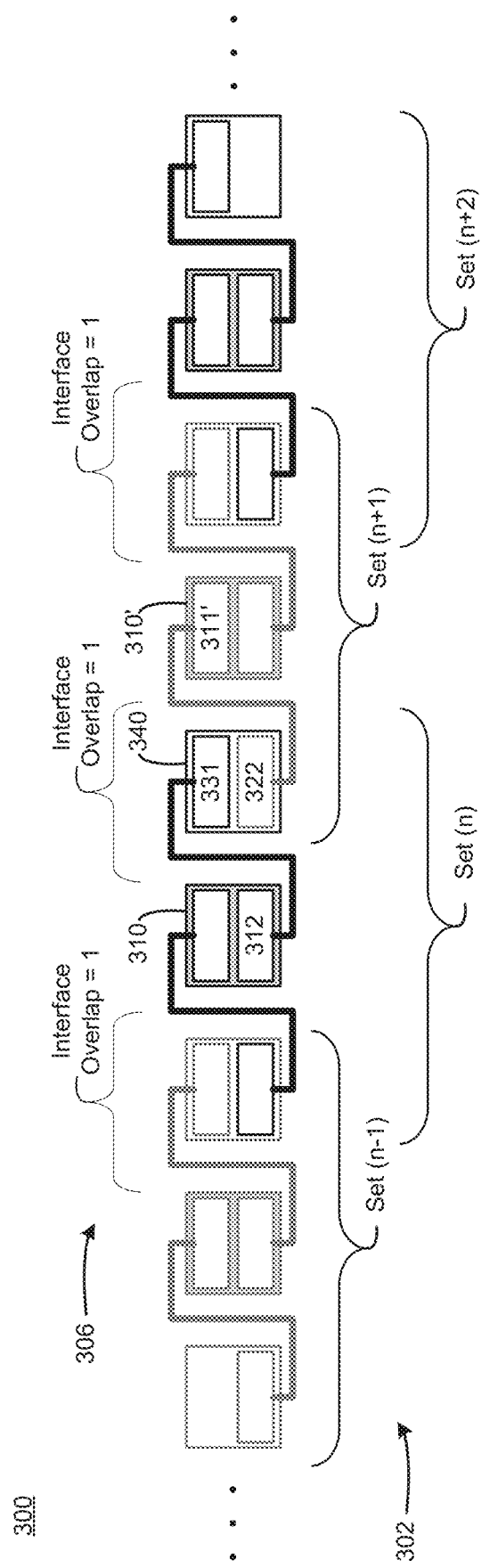
FIG. 3 is a block diagram of a backplane including a plurality of interface sets according to an example.

FIG. 3 is a block diagram of a backplane 300 including a plurality of interface sets 302 according to an example. Interface set n has an overlap 306 of one, shared with interface set (n+1) based on overlapping interface 340. A second portion 312 of first interface 310 of interface set n is coupled to a first portion 331 of overlapping interface 340. A first portion 311' of first interface 310' of interface set (n+1) is coupled to a second portion 322 of the overlapping interface 340.

The backplane 300 illustrates an example of a cascade of interfaces, based on overlapping between interface sets, to form a daisy chain arrangement of interfaces. An interface is directly connected to its neighbor interfaces, and the portions of an interface are isolated from each other based on the connections/couplings between the interface and backplane 300. An overlap occurs by virtue of an interface being associated with two different interface sets, i.e., a first portion 331 of an overlapping interface 340 is associated with interface set n. A second portion 322 of the overlapping interface 340 is associated with interface set (n+1). Four interface sets are shown, and a backplane 300 may include an arbitrary number of interface sets.

The backplane 300 forms a continuous daisy chain, and is capable of handling additional expansion of the daisy chain. For example, a compute module (e.g., "master controller") may be coupled to overlapping interface 340. Modules (e.g., storage modules) may be interfaced at first interface 310 and first interface 310', which are directly coupled to the overlapping interface 340. Accordingly, the storage modules may be under control of the master controller, based on the direct connection/coupling between those interfaces in the daisy chain cascade, Additional modules may be added to the backplane 300, e.g., to interfaces to the left of first interface 310, and to the right of interface 310'. Such modules also may be placed under control of the master controller at the overlapping interface 340, based on a "proxy" control through the storage modules at the first interfaces 310, 310'. In other words, communication between the master controller module at overlapping interface 340, and the additional modules, may be passed through the storage modules at the first interfaces 310, 310'. The modules are able to pass communications along the daisy chain, thereby bypassing the isolation between first and second portions of an interface, ensuring continuity of the daisy chain and passing of communications across the backplane 300.

Figure 4:
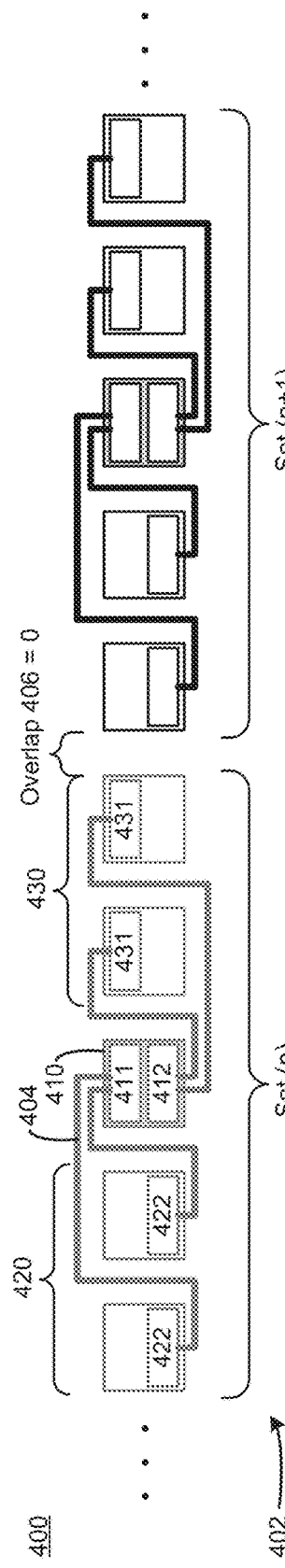
FIG. 4 is a block diagram of a backplane including a plurality of interface sets having an overlap of zero according to an example.

FIG. 4 is a block diagram of a backplane 400 including a plurality of interface sets 402 having an overlap 406 of zero according to an example. An interface set 402 includes a first interface 410, a plurality of second interfaces 420, and a plurality of third interfaces 430. A first portion 411 of the first interface 410 is coupled to second portions 422 of the plurality of second interfaces 420. A second portion 412 of the first interface 410 is coupled to first portions 431 of the plurality of third interfaces 430. Couplings 404 of interface set n are isolated by the backplane 400 from being coupled to interface set (n+1).

The backplane 400 shows two symmetrical interface sets, each having one first interface 410, two second interfaces 420, and two third interfaces 430. In alternate examples, a greater or fewer number of second/third interfaces may be used, and the interface sets may be asymmetrical with different numbers of second and third interfaces. The interface set n is isolated by the couplings 404 from the interface set (n+1) based on the overlap 406 of zero. Accordingly, communications may be shared directly among the interfaces in a set. However, a module (not shown in FIG. 4) may be used to share communications between two different sets that do not overlap. For example, a 2U module may interface with one interface from set n and another interface from set (n+1), and pass communications through that module to bridge between the two interface sets. Accordingly, the backplane 400 may support direct communications within a set, and cascaded/daisy chained communications between sets, even while having overlap 406 of zero.

Figure 5:
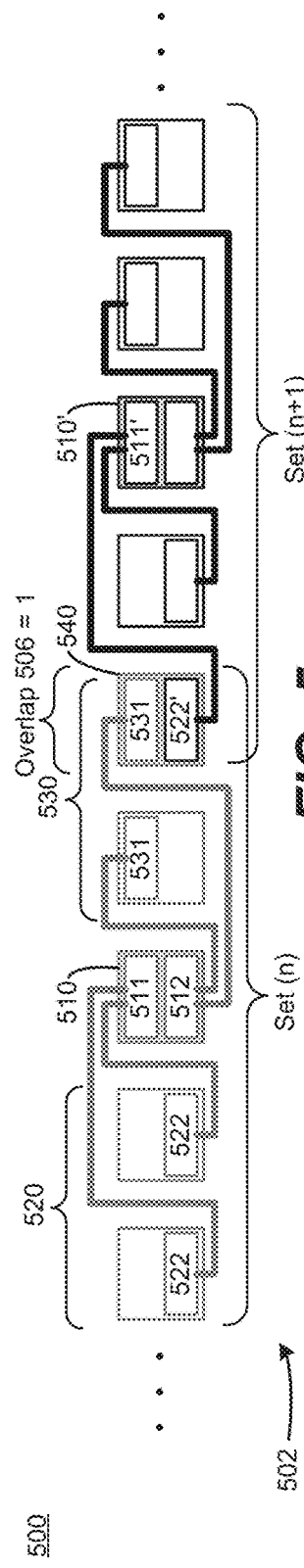
FIG. 5 is a block diagram of a backplane including a plurality of interface sets having an overlap of one according to an example.

FIG. 5 is a block diagram of a backplane 500 including a plurality of interface sets 502 having an overlap 506 of one according to an example. Interface set n includes a first interface 510, a plurality of second interfaces 520, and a plurality of third interfaces 530. A first portion 511 of the first interface 510 is coupled to second portions 522 of the plurality of second interfaces 520. A second portion 512 of the first interface 510 is coupled to first portions 531 of the plurality of third interfaces 530. Overlap 506 of one indicates that one overlapping interface 540 is coupled to interface set n and interface set (n+1). Specifically, the overlapping interface 540 includes a first portion 531 of interface set n, and a second portion 522 of interface set (n+1), The second portion 522' of the overlapping interface 540 is coupled to a first portion 511' of a first interface 510' of interface set (n+1).

The overlap 506, of one, can provide an overlapping interface 540 having a direct connection to both the interface set n and the interface set (n+1). Furthermore, because the number of second interfaces 520 and/or the number of third interfaces 530 exceeds the overlap 506, an interface set also includes at least one interface that is not coupled to another interface set (e.g., the interfaces that are directly adjacent to their corresponding first interface 510, 510'). Thus, communications may be directly shared within an interface set, and also may be shared between interface sets based on daisy chaining through the overlapping interface 540. For example, a module at the overlapping interface 540 may interface with the first portion 531 and the second portion 522', thereby bypassing the isolation between the first and second portions 531, 522' to maintain the daisy chain.

Figure 6:
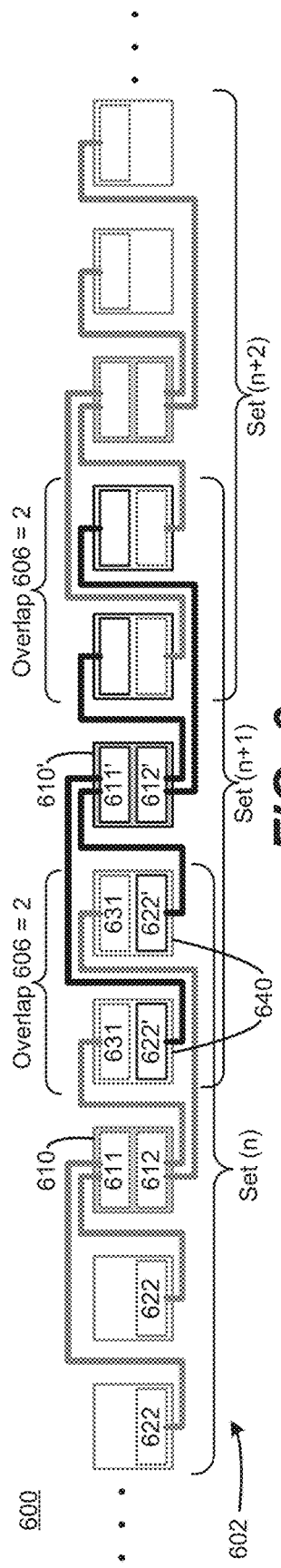
FIG. 6 is a block diagram of a backplane including a plurality of interface sets having an overlap of two according to an example.

FIG. 6 is a block diagram of a backplane 600 including a plurality of interface sets 602 having an overlap 606 of two according to an example. Interface set n includes a first interface 610, coupled via first portion 611 to second portions 622 of a plurality of second interfaces. The first interface 610 also is coupled via second portion 612 to first portions 631 of a plurality of third interfaces. Overlap 606 of two indicates that two overlapping interfaces 640 are coupled to both interface set n and interface set (n+1). Specifically, the overlapping interfaces 640 include first portions 631 of interface set n, and second portions 622' of interface set (n+1). The first portions 631 of the overlapping interfaces 640 are coupled to a second portion 612 of first interface 610 of interface set n. The second portions 622' of the overlapping interfaces 640 are coupled to a first portion 611' of a first interface 610' of interface set (n+1).

The overlap 606 of two provides two overlapping interfaces 640 having a direct connection to both the interface set n and the interface set (n+1). Thus, communications may be directly shared within an interface set, and also between the two overlapping interfaces 640. Furthermore, communications also may be shared between interface sets based on daisy chaining through one or both of the overlapping interfaces 640. As with other backplanes, a module may be interfaced with various interfaces to augment or modify the illustrated default routing provided by the arrangement of couplings of the backplane 600.

Figure 7:
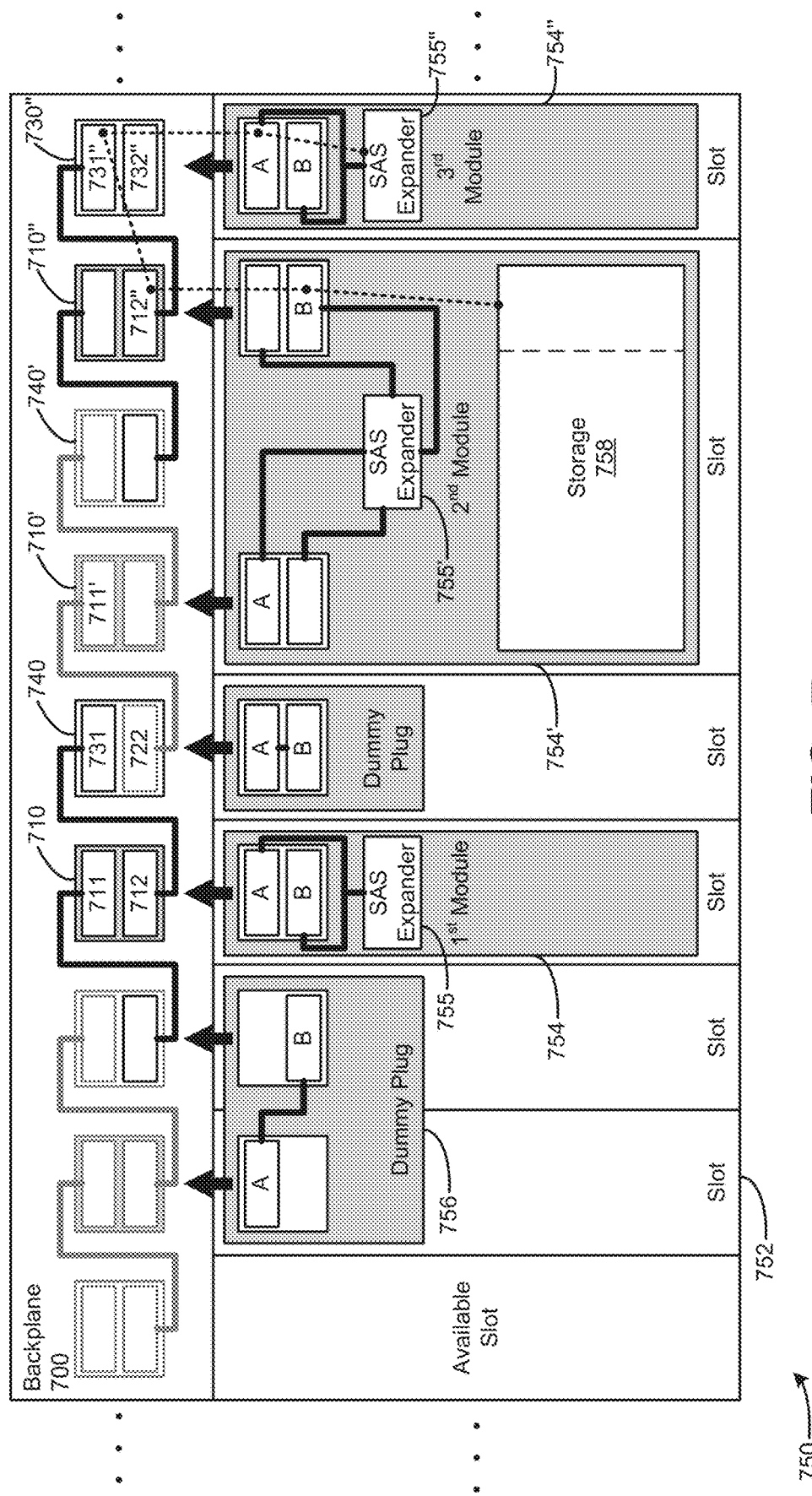
FIG. 7 is a block diagram of a device including a backplane and chassis according to an example.

FIG. 7 is a block diagram of a device including a backplane 700 and chassis 750 according to an example. The backplane 700 includes a plurality of first interfaces 710, 710', 710" coupled to a plurality of overlapping interfaces 740, 740' and a third interface 730" in a cascade arrangement. The first interface 710 includes a first portion 711 and a second portion 712, which is coupled to a first portion 731 of overlapping interface 740. A second portion 722 of overlapping interface 740 is coupled to a first portion 711' of first interface 710'. A second portion 712" of first interface 710" is coupled to a first portion 731" of third interface 730", which includes first portion 731" and second portion 732". The chassis 750 includes a plurality of slots 752 to receive a plurality of modules 754, 754', and 754", and dummy plugs 756. The first module 754 includes an expander 755 coupled to a module interface having portions A and B. The second module 754' includes storage 758 and an expander 755' coupled to module interfaces having portions A and B. The third module 754" includes an expander 755" coupled to a module interface having portions A and B. Module interfaces are coupleable to backplane interfaces.

The chassis 750 supports plug-and-play of storage modules, such as second module 754', without a need for configuration (e.g., the storage module is insertable in a slot that shares communication with a server, such as third module 754", and is compatible with auto configuration to support communication between the two modules across the backplane 700). Additional storage may be added to that server module, by plugging another storage module within communication range of that server across the backplane 700. The backplane 700 supports such block-by-block building up of the server storage. Additionally, the buildable architecture may be accomplished regardless of a width of a module/tray to be installed in the chassis 750, while still maintaining connectivity between modules.

Storage 758 may be shared between multiple servers, based on zoning. The example of FIG. 7 shows a first server (first module 754), storage (second module 754'), and a second server (third module 754"). Zoning enables the storage 758 of the second module 754' to be shared, modified, and logically partitioned between the two servers 754, 754". An additional slot lies between the two servers 754, 754", shown occupied by a dummy plug at overlapping interface 740. However, another module (e.g., storage) may be inserted into that slot, also to be zoned or otherwise assigned between one or both of the servers 754, 754". The chassis 750, and backplane 700, support logical partitioning of the storage subsystem (e.g., formed by module 754'). Furthermore, storage and server modules may be extended to additional devices or bays. Zoning allows customizability (e.g., via software and/or firmware, or default hardware arrangements/jumpers) of resources. In an alternate example, the arrangements may be defined by a default system, and may be hard-wired based on the physical couplings/jumpers and/or physical arrangements of the backplane/modules (e.g., assign/couple to the right).

In an example, the backplane 700 within the chassis 750 may serve as a common interconnection point for the pluggable modules 754, 754', 754" that connect into the backplane 700. The backplane 700 is shown having a cascade arrangement, where an interface set overlaps with its adjacent interface set(s). The chassis 750 includes a plurality of bays/slots 752 to receive the modules. In an example, a 5U chassis may include ten 1U bays. The chassis 750 may be 42 inches deep, for use with a 1.2 m standard rack. In an alternate example, the chassis 750 may be 32 inches deep, for use with a 1.0 m standard rack. The backplane 700 has multiple sets of interfaces (which may have a set of portions/connectors), where an interface is assigned to a chassis slot 752. Each interface may comprise one or more physical connectors/portions. The chassis slot 752 may have a width that represents a mechanically size of a least common denominator "U" of a modular device (e.g. blade or tray). Backplane couplings, such as electrical traces, connect the signals from a first portion of one interface (e.g. first portion 731) to a second portion of another interface (e.g. second portion 712). When a third module 754" (e.g. a compute module) is inserted into a slot 752, and second module 754' (e.g. a storage module) is inserted into another slot, the connectivity/couplings on the backplane 700 provides a closed-circuit path, effectively connecting the two modules 754', 754" together.

The connectable slots 752 occupied by second and third modules 754, 754" are adjacent to one another, and are associated with the backplane 700 via interfaces 710', 710", and 730". A second portion 712" of signals of interface 710" are coupled to the first portion 731" of signals on interface 730". Similarly, a first portion 711' of signals on interface 710' are coupled to a second portion 722 of signals on shared interface 740. However, the backplane 700 does not include a direct coupling between interface 730" and interface 740. Connectivity between interfaces 730" and 740 is daisy chained through the backplane interfaces and the second module 754' via its module interfaces and module couplings/connections. The backplane 700 is shown as a single-overlap daisy chain, although other storage fabric backplane topologies may be employed to provide different interconnect strategies between the modular components (e.g., direct connect where an interface set has X second interfaces, Y third interfaces, and overlap V between N interface sets). Such topologies can provide direct connection/attachment of one slot to one or more other slots. Furthermore, a combination/hybrid of multiple direct connected and cascaded modular devices is also possible.

A modular device that connects into the backplane 700, such as second module 754', may divide (symmetrically or asymmetrically) its physical interconnection signals (e.g.

"lanes") across first and second portions of one or more interfaces. This enables corresponding portions of communication bandwidth to be sent across the lanes to the left and right interfaces of the backplane 700 coupled to the module. A module, such as second module 754', may span across multiple enclosure/chassis slots 752, whereby the module may provide proper connectivity through itself across the backplane 700, and can modify and/or avoid breaking the daisy-chain (or other) connectivity scheme of the backplane 700. For example, the second module 754' may carry communications between interfaces 710' and 710" across ports A and B of the second module 754', thereby bypassing use of the interface 740' of the backplane 700. The connection scheme of the backplane 700 thus may be maintained and extended within a modular component that interfaces with the backplane 700. Furthermore, similar to maintaining connectivity, a module also may prevent connectivity (e.g. force isolation/partition) between interfaces and/or first/second portions of an interface. For example, a module may remove its (partial or full) connectivity to the backplane 700, by selectively and internally preventing communication between its ports that are interfaced with the backplane 700. Thus, although a module may be physically coupled to a portion of an interface, the module may internally isolate communications between those portions/interfaces. For example, a SAS Expander 755' may block communications between particular portions of an interface, based on a software/modifiable configuration of the expander 755' and/or a default hardware/jumper-based configuration.

Modules 754, 754', 754" are shown having a controller, such as a bridge chip or SAS expander 755, 755', 755". Additional chips may be used, such as a driver chip (not shown) to drive signals from one interface/module to the next to maintain signal integrity. In an example, a repeater/fast switch/buffer may be used in a module or between modules to maintain signal re-driving from one bay to another. In an alternate example, e.g., having physically shorter boards or slower transmission speeds, a straight coupling without a repeater may be supported without suffering unacceptable signal degradation over the physically shorter/slower path.

The storage module 754' may provide a scalable storage solution, and may be hot pluggable or non-hot pluggable. A hot pluggable hard drive may serve as storage 758 of the storage module 754', allowing the storage 758 to be serviced without breaking continuity of the daisy chained communications across the backplane 700. In an example, to service a drive, the tray of module 754' may slide out of the chassis 750, and the module 754' may include a cabling system (which may include an intermediate circuit board between the backplane and drive) that couples the cables into backplane headers for maintaining interfacing with the backplane 700 while allowing the module 754' to slide in and out. Accordingly, modules 754, 754', 754" may allow for serviceability of their components/hard drives, while still maintaining continuity of the backplane 700 (e.g., without breaking the daisy chain arrangement of the backplane 700). Furthermore, the storage 758 itself may be hot-pluggable relative to the module containing it.

Module 754, 754', 754" may establish logical connectivity with the backplane 700, and other modules, based on various techniques (including denying connectivity between two modules across the backplane 700). A signal (e.g., as illustrated by dashed lines) may be used to allow adjacent (or connecting) modular devices to determine if they are able to establish/facilitate/allow connectivity between each other. The signal may be a strapping signal, a check for a jumper configuration on a module, or other information. The signal information may be contained in a non-volatile storage device such as an EEPROM or a non-volatile random access memory (NVRAM) device, and the signal may be coordinated by a mechanism (e.g., a controller of a module or a separate controller) to obtain and exchange configuration information from a device. For example, if two storage controller adapters (e.g. masters) are attached to each other, the signal may be used to block those modules from communicating with one another, and effectively create an isolated (storage) domain between the two modules. In the case of a storage controller (e.g., first module 754) occupying a slot 752, and two storage modules occupying the next two slots (one of which is illustrated as a dummy plug between the first module 754 and the second module 754'), an example backplane 700 may enable the first module 754 to connect automatically with the adjacent device, and effectively assign the adjacent device's resources to the first module 754 (or vice versa). Similarly, the second module 754' logically may be treated as a storage extension of the adjacent module, and also may communicate across the link between the first module 754 and the adjacent module, such that the first module 754 may control, and have communication paths to, both its adjacent module and the second module 754' (through the adjacent module).

The backplane 700 is shown having a cascaded daisy chain arrangement. Accordingly, an unused slot 752 may serve as a break in the daisy chain. As shown, an available slot is at an end of the chassis 750, thereby allowing full operation of the backplane 700 without breaking the daisy chain. A dummy plug 756 may be used to span the daisy chain across an otherwise unused slot 752. Accordingly, communications across backplane 700 may pass across at least one interface associated with the dummy plug 756, which may span across one or more interface(s). The backplane 700, and corresponding dummy plugs 756, may use passive couplings. In an example, the dummy plug 756 may be a jumper board. In an alternate example, the backplane 700 may be an active backplane having a controlled connection at each interface. Accordingly, the active backplane 700 may self-span across an unused interface based on software to manipulate the controller of an interface to bypass the isolation between portions of the interface, such as a backplane driver or other controller (not shown, but which may be similar to the expander 755' coupled to module interfaces, except contained in the backplane and coupled to backplane interfaces).

A module 754 may include a controller 755, shown as a SAS expander. Controller 755 also may be a bridge chip or other controller to manage communication traffic in the module and/or between first/second portions of interfaces. For example, the SAS expander 755 of the first module 754 may provide a bypass at that slot, allowing communication of interface 710 to pass from first portion 711, to port A of the first module 754, to the SAS expander 755, to port B of the first module 754, to the second portion 712 of the interface 710 of the backplane 700. Accordingly, the SAS expander 755 may allow backplane communications to bypass its module 754, according to a configuration of the SAS expander 755. Alternatively, the SAS expander 755 also may route communications at ports A or B to and/or from the first module 754, enabling the first module 754 to communicate with and/or across the backplane 700 and other modules interfaced with the backplane 700.

Accordingly, backplane 700 may be configured as shown, to enable passive connectivity between adjacent modules, providing connectivity between modules that are side-byside in an enclosure/chassis 750, regardless of whether a module is as wide as, or wider than, a single slot 752 of the chassis 750. More specifically, the backplane 700 includes a plurality of overlapping interface sets, including a plurality of overlapping interfaces 740, with a portion of adjacent interfaces being directly connected to each other. In an alternate example, the backplane 700 may include one or more direct paths from one interface to another non-adjacent interface. Accordingly, such an alternative example backplane 700 would be able to directly connect a module in a first slot 752 with another module located more than one slot away from that module (see, e.g., backplane 500 of FIG. 5, although direct connections may span an arbitrary distance across an arbitrary number of interfaces).

The second module 754' illustrates an example of the backplane 700 accommodating a device spanning across multiple backplane interfaces. The second module 754' is shown having interfaces along a left and right periphery of the second module 754'. In an alternate example, a module may have interfaces away from a left and right periphery of that module (e.g., at a middle of the module). The SAS expander 755' of the second module 754' provides interconnections from various portions of the interfaces, as well as the components within the second module 754' (e.g., storage 758). Because the module interfaces providing ports A and B of second module 754' are located at the left and right periphery of the second module 754', a backplane interface 740' may not be used directly. However, the cascaded connections of the backplane 700 are maintained, by the SAS expander 755' of the second module 754', ensuring continuity of communications between the first interface 710' and the first interface 710" of the backplane 700.

Zoning also may be used to apportion the storage 758 of the second module 754' between one or more other modules (e.g., first module 754 and third module 754"). An enclosure manager, or other software, may serve up a user interface to allow user-defined usage of which bays/slots of which storage sled or zones of which server/chassis 750 will be allowed to attach to at least a portion of the storage 758 of the second module 754'. The enclosure manager may run on the second module 754' itself, or another module/controller within or external to the chassis 750. The enclosure manager may communicate zoning information to appropriate expanders (e.g., SAS expanders 755, 755") for various implementations. Zoning may enable a module to be interfaced with the chassis 750, while still maintaining isolation between first/second portions of a given interface of the backplane 700.

The example of FIG. 7 illustrates zoning, through the backplane 700, to assign a portion of the storage 758 to the third module 754". Accordingly, communications between the third module 754" and the storage 758 may traverse the backplane 700 via third interface 730" and first interface 710". More specifically, communications from the SAS expander 755" may pass through port A of the third module 754", to the first portion 731" of the third interface 730". Those communications traverse the coupling of the backplane 700, from first portion 731" of the third interface 730", to the second portion 712" of the first interface 710". The communications then may pass to/from the second module 754' via port B interfaced with the second portion 712". The SAS expander 755' may then pass the communications from the port B to the storage 758. Thus, communications may pass back and forth between the storage 758 and the third module 754". Zoning may be used to direct the SAS expander 755' of the second module 754' to enable the third module 754" to access only a portion of the storage 758, allowing remaining portions of the storage 758 to be isolated from the third module 754" and/or shared with other modules.

Figure 8:
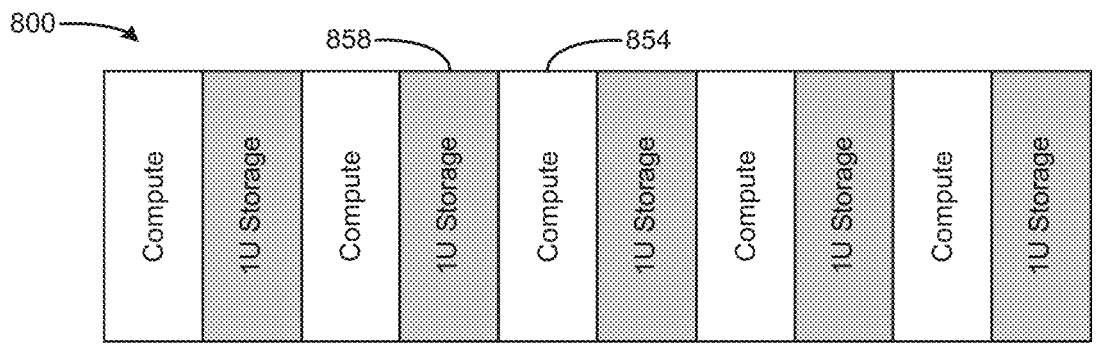
FIG. 8 is a block diagram of a backplane including an arrangement of modules interfaced with the backplane.

FIG. 8 is a block diagram of a backplane 800 including an arrangement of modules 854, 858 interfaced with the backplane 800. Compute modules 854 and storage modules 858 alternate in a one-to-one ratio.

A total of ten modules are shown, with five 1U compute modules 854 and five 1U storage modules 858, alternating in a 1:1 mapping. Accordingly, FIG. 8 illustrates an example of a ten-bay chassis, where a storage module 858 is assigned to a compute module 854. Zoning enables the storage modules 858 to be assigned in other arrangements. However, the backplane 800 may enable passive 1:1 mapping as shown, based on a default cascade daisy-chain arrangement of couplings in the backplane 800, without a need to set up zoning or other software configuration.

Figure 9:
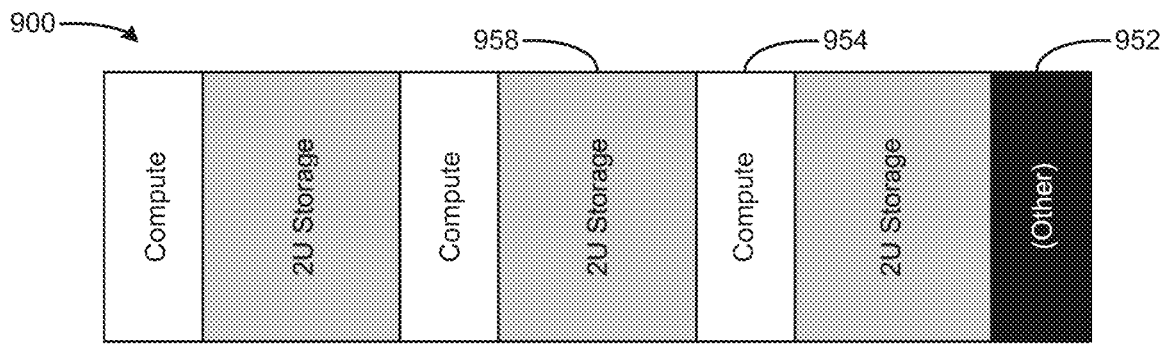
FIG. 9 is a block diagram of a backplane including an arrangement of modules interfaced with the backplane.

FIG. 9 is a block diagram of a backplane 900 including an arrangement of modules 952, 954, 958 interfaced with the backplane 900. Compute modules 954 occupy a single slot (1U), and storage modules 958 occupy a double slot (2U). Compute modules 954 and storage modules 958 alternate in a one-to-one ratio. Other module 952 may represent an available expansion slot or other component, and is shown as occupying a single slot (1U).

Backplane 900 may represent a ten-bay chassis, filled with 3 compute modules 954 and 3 storage modules 958, connected to each other via 1:1 mapping. The other module 952 may be an empty bay, another server, or other device, which may be assigned to one or more other modules 954, 958 (e.g., based on zoning). Backplane 900 may be based on a direct-connect or cascade arrangement of interfaces and couplings. Backplane 900 may use a default arrangement, e.g., having a compute module 954 default-coupled to the storage module 958 to its right, without a need to specifically configure zoning or other software setup, due to the specific coupling and patterns of the backplane 900 and arrangement of interface sets.

Figure 10:
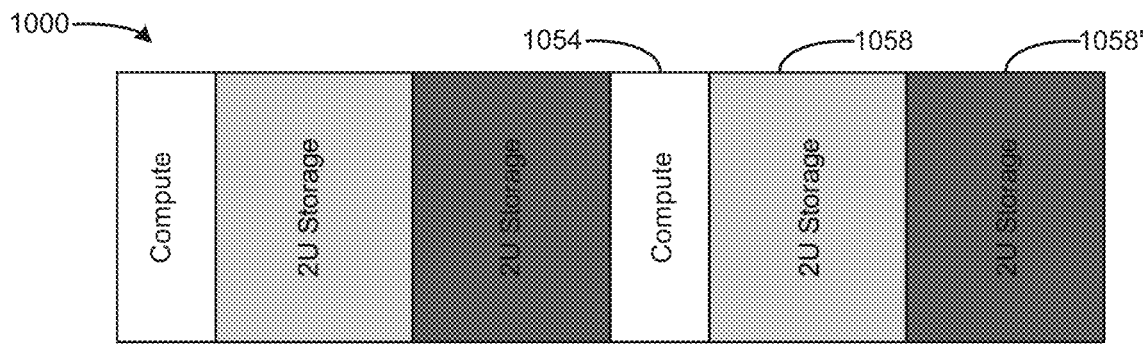
FIG. 10 is a block diagram of a backplane including an arrangement of modules interfaced with the backplane.

FIG. 10 is a block diagram of a backplane 1000 including an arrangement of modules 1054, 1058, 1058' interfaced with the backplane 1000. Compute modules 1054 occupy a single slot (1U), and storage modules 1058, 1058' occupy a double slot (2U). Compute modules 1054 and storage modules 1058, 1058' alternate in a one-to-two ratio of compute, storage, storage.

Backplane 1000 may be based on an asymmetric directly connected interface set, where an interface associated with the compute module 1054 is directly connected to an interface of the first storage module 1058 and an interface of the second storage module 1058'. Alternatively, backplane 1000 may be based on symmetric directly connected, or symmetric cascaded/daisy chained interface sets. For example, a cascaded backplane may accommodate the compute module 1054 at one interface, and the storage modules 1058, 1058' may span across two interfaces each. Communications thus may be cascaded across the backplane, through the various modules (e.g., using a default zoning approach). However, zoning may be used to assign and/or partition the storage modules and compute modules as desired, regardless of the underlying hardware arrangement of the couplings/interfaces/interface sets of the backplane 1000.

Figure 11:
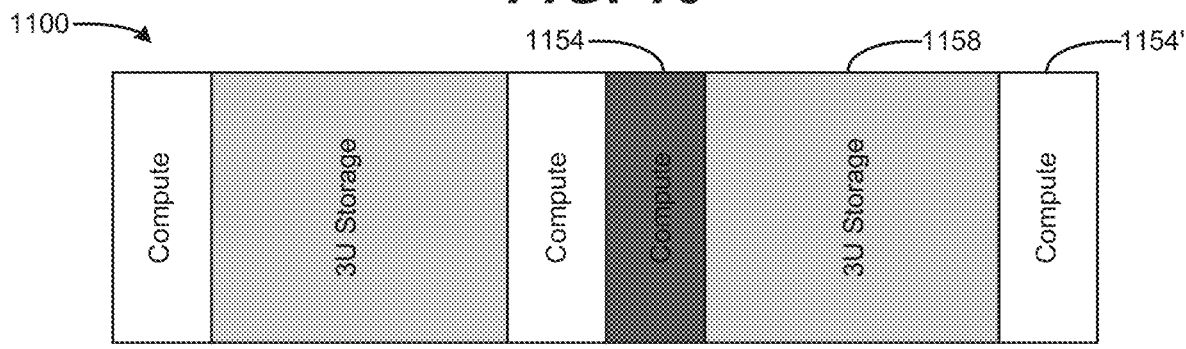
FIG. 11 is a block diagram of a backplane including an arrangement of modules interfaced with the backplane.

FIG. 11 is a block diagram of a backplane 1100 including an arrangement of modules 1154, 1154', 1158 interfaced with the backplane 1100. Compute modules 1154, 1154' occupy a single slot (1U), and storage modules 1158 occupy a triple slot (3U). Compute modules 1154, 1154' and storage modules 1158 alternate in a two-to-one ratio of compute, storage, compute.

A chassis having ten bays/slots may be used to accommodate the modules of backplane 1100, where four bays are occupied by the compute modules 1154, 1154', and six bays total are occupied by the storage modules 1158. A storage module 1158 may be apportioned (e.g., using default backplane couplings, or configurable zoning) between various compute modules. In an example, the backplane 1100 allows a storage module 1158 to be shared by the two adjacent compute modules 1154, 1154' surrounding the storage module 1158. The backplane 1100 also allows isolation to be maintained between modules. For example, the backplane 1100 may isolate the one compute module 1154 from another adjacent compute module, even though the two compute modules are adjacent to one another in the chassis. Such isolation may be automatic, e.g., based on strapping signals, firmware, default zoning rules, or other arrangements. Accordingly, the various modules simply may be plugged into the chassis, and may automatically configure communications among themselves (e.g., based on location/proximity, and whether they are adjacent to a device to which they should be communicating or isolated from). Accordingly, the backplane 1100 may be based on a cascade and/or a direct connect arrangement of interface sets, while accommodating the illustrated module arrangement.

Figure 12:
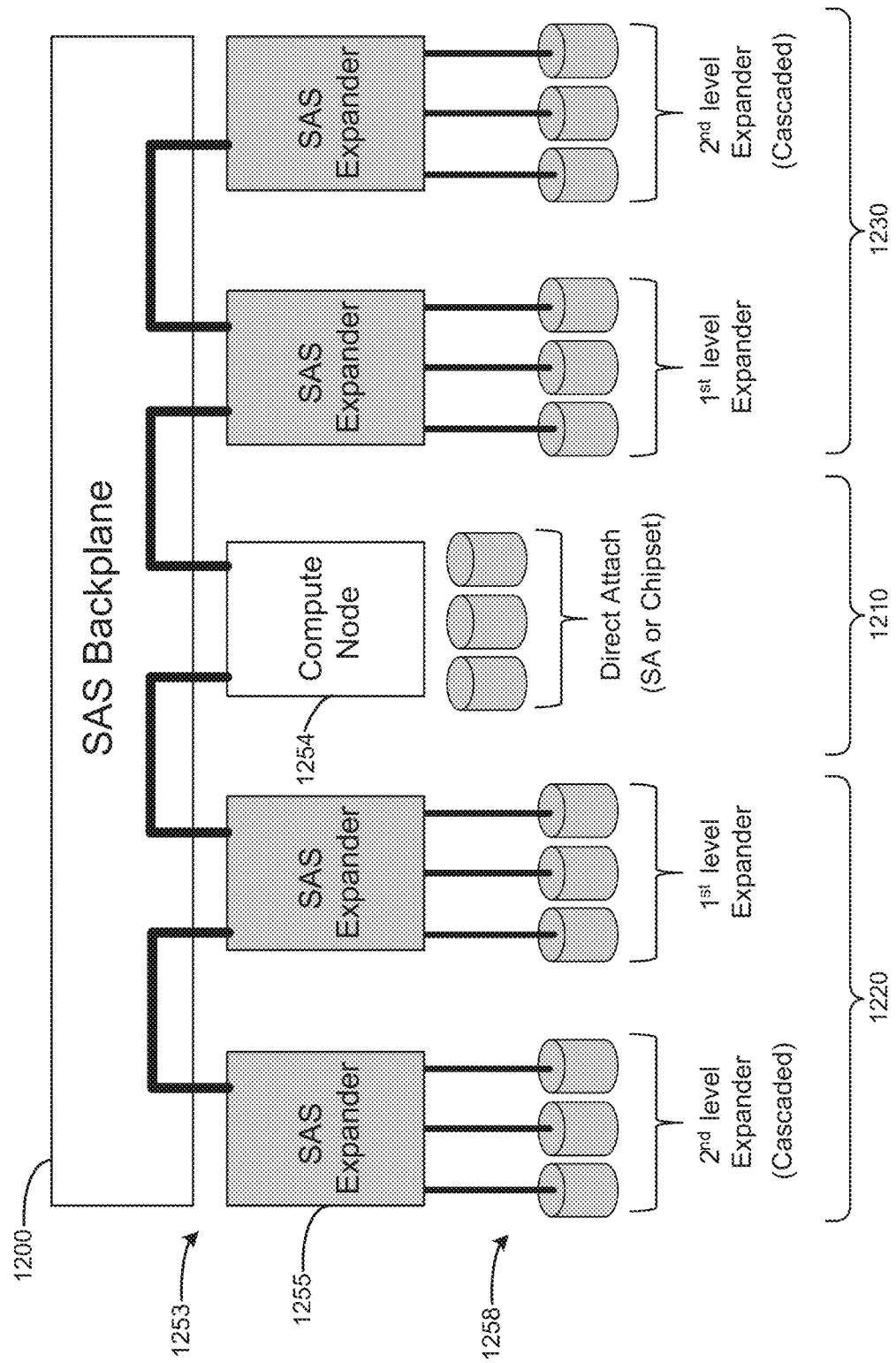
FIG. 12 is a block diagram of a backplane including an arrangement of modules and storage interfaced with the backplane.

FIG. 12 is a block diagram of a backplane 1200 including an arrangement of modules 1253 and storage 1258 interfaced with the backplane 1200. The backplane 1200 is to provide interconnections between the modules 1253, which include first module 1210, second modules 1220, and third modules 1230. FIG. 12 illustrates an example of a cascade module arrangement of SAS modules 1253, although other arrangements and types of modules 1253 are possible.

The first module 1210, the second modules 1220, and the third modules 1230 are associated with storage 1258. In an example, a module may include a tray to house a controller (e.g., a central processing unit (CPU) in the case of a compute node, and/or an expander chip in the case of an expander module) and one or more storage devices such as a hard drive. The backplane 1200 couples the compute node 1254 to storage 1258, regardless of which module the storage 1258 has been directly attached to. The backplane 1200 provides a direct coupling between the compute node 1254 and an adjacent one of the second modules 1220 and an adjacent one of the third modules 1230, referred to as first level expanders. Accordingly, communication between the compute node 1254 and the first level SAS expanders may be directly exchanged, along the backplane coupling. Similarly, according to a cascaded/daisy chain arrangement, the backplane 1200 also provides a direct coupling between a first level expander, and a corresponding second level expander. Accordingly, communications between the compute node 1254 and a second level expander are cascaded through the corresponding first level expander. Thus, communications to/from the first level expanders traverses directly across the backplane 1200, and communications to/from the second level expanders includes one "hop" across the first level expanders. The example backplane 1200 of FIG. 12 illustrates five interfaces and five modules 1253. However, the backplane 1200 may include an arbitrary number of interfaces coupled together, and storage/compute modules may be added accordingly.

The couplings between modules may be established mechanically by the passive wiring/traces laid out in the backplane 1200, where a portion of one interface is directly coupled to a portion of another interface, and first and second portions of an interface are isolated by the backplane couplings from each other at that interface. The backplane 1200 also may include a backplane controller (not shown) to provide active control over the various backplane couplings (e.g., connecting or disconnecting a coupling from an interface, interface portion, and/or another trace/coupling, including connecting or disconnecting first and second portions of an interface from each other). The communications between portions of an interface (or between interfaces where a module spans more than one interface) also may be passed, or isolated, based on configuration of a module coupled to an interface of the backplane 1200. Zoning may be used to configure a module to pass or isolate those communications, e.g., whether to daisy chain communications across the first and second portions of the module's interface of the backplane 1200 (or from one interface to another). The backplane 1200 and modules 1253 may interoperate with industry software and methodologies for directing operation of servers/modules. In an example, a firmware software implementation may be used to establish zoning attributes for the modules 1253, including the storage subsystems 1258, SAS expanders 1255, and compute node(s) 1254. Examples may provide a zoning manager to accommodate different topologies associated with the backplane 1200 and modules 1253, based on configuration information exchanged with the backplane 1200 and the modules 1253.

Configuration data can be provided, either directly to a module/backplane 1200, or through a third party component such as a zoning manager, to achieve the zoning. The configuration data may coordinate the logical connectivity, ownership, and/or associations among the various components and their interaction with the backplane 1200. Zoning enables the resources of a first module 1253 and/or storage 1258 to be partitioned in part or whole to a second module 1253 and/or storage 1258. Zoning also enables formation and maintenance of logical partitions regarding communications, to enable and/or prevent communications to pass between components (e.g., adjacent and/or non-adjacent components along the backplane 1200). In an example, zoning of communications along the backplane 1200 may provide isolation to create isolated security zones for one or more modules 1253 and/or storage 1258. A module may be associated and/or identified based on physical location (such as an interior slot location in a chassis), unique logical identifier (e.g. a universal unit identification (UUID), serial number, namespace etc.), or other module identification. A combination of associativity techniques may be used to validate and/or update communication connections along the backplane 1200. For example, in the case of replacing a failed module 1253 or one of its subunits (e.g. hard drive/storage 1258). In the example backplane 1200, a module 1253 is physically connected by backplane couplings to adjacent modules 1253, enabling the modules 1253 and their subsystems 1258 to be dynamically reallocated and/or configured to create different logical partitions and isolated security zones. In an example, the compute node 1254 may be allowed to "see" the first level expanders 1255, but be isolated from the $2^{nd}$ level expanders 1255.

The backplane 1200 enables assignment of relationships based on, e.g., directional/default passive cascading, or custom and/or active management by a module 1253 and/or the backplane 1200 itself. A central configuration manager (e.g., zoning manager, not shown) may be coupled to and/or integrated with the backplane 1200, to push configuration information out to the modules 1253. The configuration information may direct a module to bypass isolation between first and second portions of an interface, and/or bypass isolation between different interfaces, affecting whether a direct connection and/or cascade/daisy chain of communication is allowed by the backplane 1200. Dynamic capabilities may be enabled by the backplane 1200, based on passive coupling at the backplane 1200, and active mechanisms interfaced with the backplane 1200. In an example, a pool of storage 1258 may be connected to the backplane 1200 through various modules 1253. An assignment process, or requests for assignment, may be used to allocate storage to a module (e.g., to compute node 1254), to a pool of freely available storage, to a reserved pool, and/or allocated to another device. Thus, backplane 1200 enables a module 1253 to request an available storage 1258, and the request may be propagated by the couplings of the backplane to other modules 1253. A storage module 1255 may respond to the request, which may be propagated by the backplane 1200 to the requesting module 1253. The requesting module 1253 may instruct the storage module 1255 to reserve that storage 1258, and mark the storage as active or reserved (e.g., for failover capability or future use), and so on. The passive couplings of the backplane 1200 enable management of the resources at various desired levels in communication with each other over the backplane 1200, whether that be at the individual drive/storage 1258, or the expander module 1255 that is controlling those drives/storage 1258, or at a higher level such as compute node 1254 or a zoning manager. The backplane 1200 may be associated with a configuration table or other memory resource to maintain ownership assignments of various devices/modules. The memory resource may be implemented as a part of the storage fabric, the backplane 1200, or a management network, e.g., which may be an out-of-band type management interface. Such controllers may be integrated with the backplane 1200, or provided separately from the backplane 1200.

Accordingly, zoning is enabled by the backplane 1200, based on the daisy chaining/cascaded couplings between interfaces having first and second portions. The backplane 1200 provides a logical path over which communications/transactions may traverse, and may start at one bookend of the backplane (e.g., at a server in a chassis slot at the periphery of the chassis) and traverse the entire backplane 1200 to the other end. Communication paths are provided anywhere along that line for one module to potentially be allocated another module (drive) in the zoning scheme.

The cascaded approach illustrated in the example backplane 1200 may enable the daisy chain to be broken by removing a module 1253 that was previously included in the communication path from one interface to another. From a serviceability aspect, a passive dummy plug may be used to restore the connectivity along the backplane by providing a coupling to connect the interfaces and/or interface portions previously occupied by the removed module 1253. In an alternate approach, the backplane 1200 also may include one or more direct attached connections, e.g., based on an interface set having more than one second and/or third interfaces directly connected to a first interface. Direct connections may provide enhanced performance for modules interfacing with each other over direct connections, compared to a cascaded approach where communications from one module to another may be daisy chained through an intermediate module.

Figure 13:
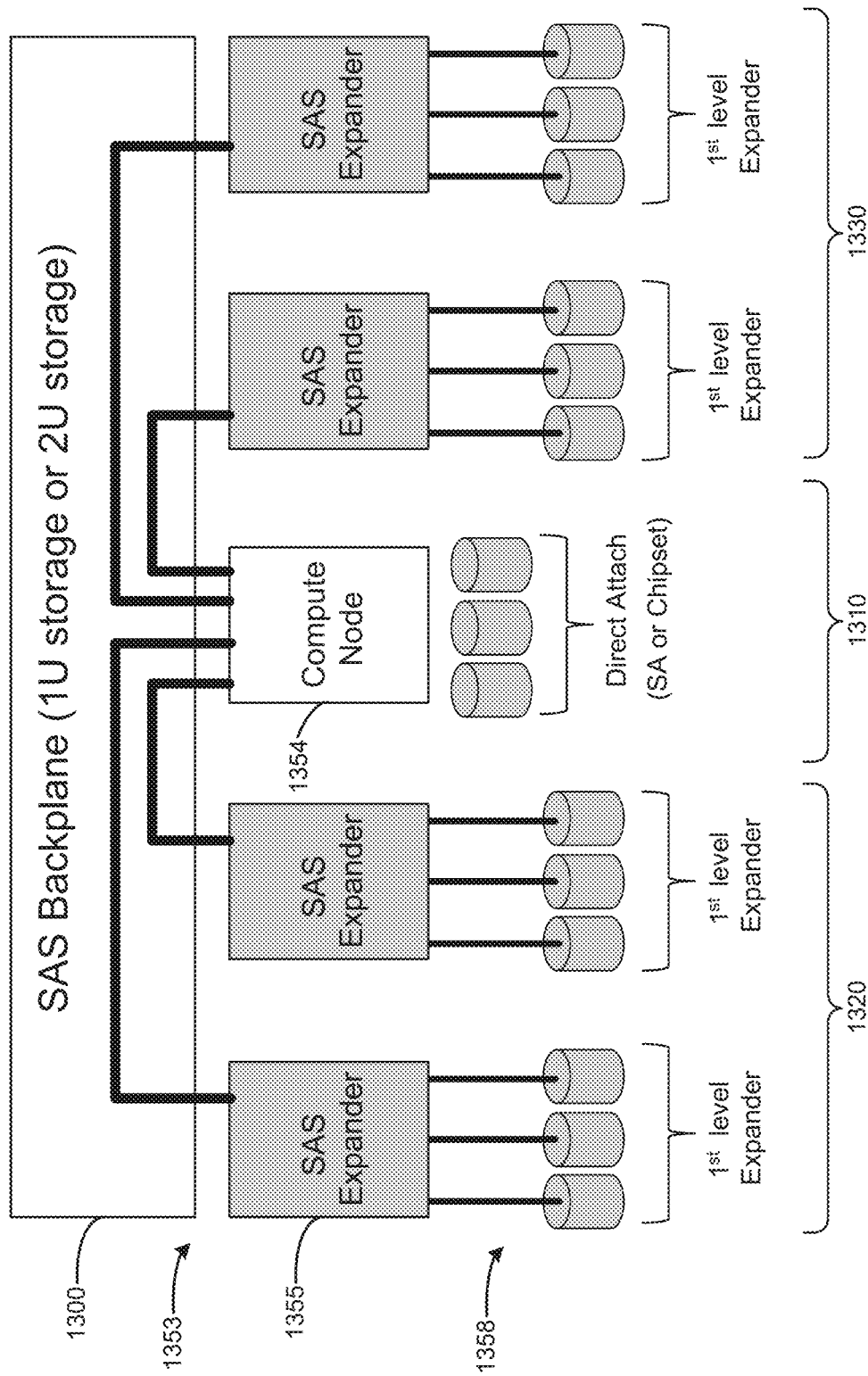
FIG. 13 is a block diagram of a backplane including an arrangement of modules and storage interfaced with the backplane.

FIG. 13 is a block diagram of a backplane 1300 including an arrangement of modules 1353 and storage 1358 interfaced with the backplane 1300. The backplane 1300 is to provide interconnections between the modules 1353, which include first module 1310, second modules 1320, and third modules 1330. FIG. 13 illustrates an example of a direct connection module arrangement of SAS modules 1353, although other arrangements and types of modules 1253 are possible.

The backplane 1300 provides direct connections between the compute module 1354 and the plurality of SAS expander modules 1355. Accordingly, the four illustrated SAS expander modules 1355 are first level expanders, with no need for the backplane 1300 to cascade communications through an intermediate node to second level expanders (not shown). In an example, the backplane 1300 includes an interface set having first portions of a first interface 1310 coupled to second portions of second interfaces 1320. Second portions of the first interface 1310 are coupled to first portions of the third interfaces 1330. Thus, the compute module 1354 may communicate with storage 1358 of the various expander modules 1355 along corresponding portions of the first interface 1310.

In an alternate example, the storage modules 1355 may be exchanged with compute modules, and the compute module 1354 may be exchanged for a [large] storage module, such that the backplane 1300 enables multiple connections from multiple host servers (e.g., compute modules 1354) into a single storage node (an expander module 1355). Thus, usage of storage 1358 may be maximized, by avoiding any accumulated unused space across many individual dedicated storages 1358 for a plurality of storage modules. Backplane 1300 enables resources of a module to be amortized/shared to make the most use of that volume by selectively allocating access to it from a certain number of modules.

Figure 14:
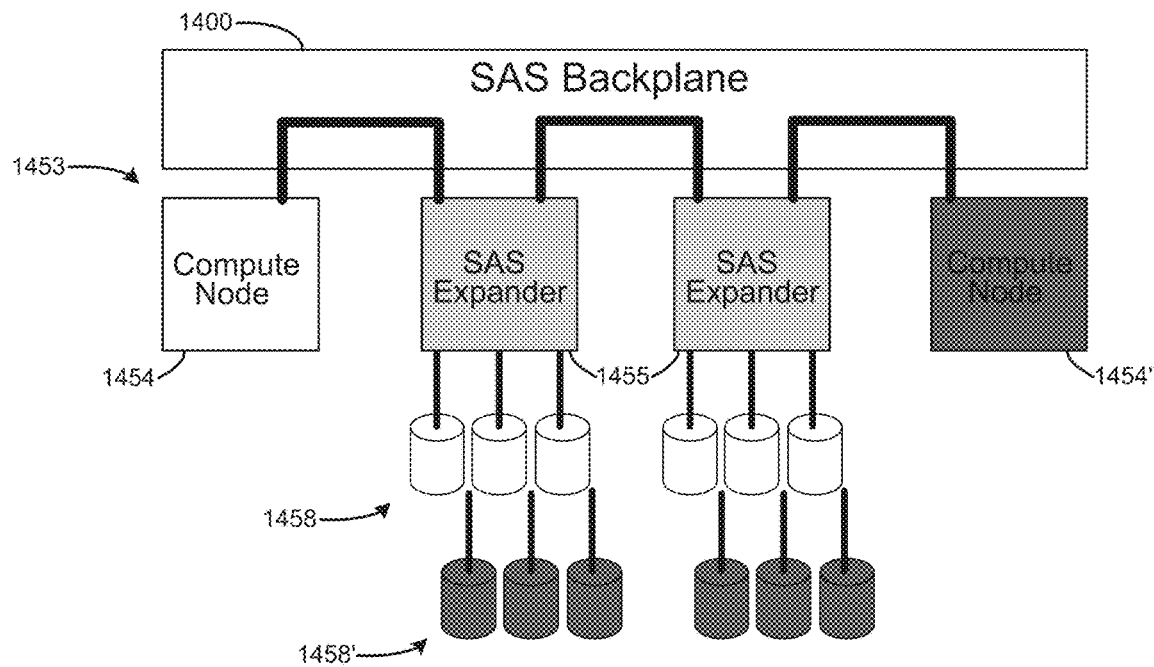
FIG. 14 is a block diagram of a backplane including an arrangement of modules and storage interfaced with the backplane.

FIG. 14 is a block diagram of a backplane 1400 including an arrangement of modules 1453 and storage 1458, 1458' interfaced with the backplane 1400. The backplane 1400 is to provide interconnections between the modules 1453, which include compute modules 1454, 1454', and storage modules 1455.

The backplane 1400 illustrates a cascaded daisy chain arrangement of couplings between interfaces. The modules 1453 include multiple compute modules 1454, 1454', and multiple storage modules 1455. Furthermore, the compute modules may be isolated from communicating with each other based on zoning and/or physical couplings of the backplane 1400. Each compute module has a corresponding storage, where compute module 1454 is associated with storage 1458, and compute module 1454' is associated with storage 1458'. Furthermore, a first compute module may be isolated from communicating with the storage associated with the second compute module, and vice versa, even though both types of storage 1458, 1458' are coupled to each of the storage modules 1455.

Zoning the modules and storage may be achieved using management signals, such as a strapping signal or other sideband signal. A sideband signal can help manage modules and isolate one master compute module 1454 from communicating directly with the other compute module 1454 based on simplistic rules (e.g., a compute module shall not associate with another compute module). However, FIG. 14 illustrates a more complex arrangement where a potentially assignable group of resources/storage 1458, 1458' are connectable to two "master controllers" (compute nodes 1454, 1454'). There is a need to determine which compute node may control which storage resource. An example zoning/management policy may mandate that the default configuration is to only enable associativity in one direction (e.g. to the right). In such an arrangement, the compute module 1454 would be assigned to both storage 1458, 1458' of both storage modules 1455, and compute node 1454' would ignore (e.g., logically disconnect) its connectivity to the storage modules 1455. However, the backplane 1400 enables zoning to allow communications to cascade from one end of the backplane 1400 to the other. Accordingly, the first compute module 1454 may be associated with both storage modules 1455, and the second compute module 1454' also may be associated with both storage modules 1455. Further, each storage module 1455 may maintain logical separation between first storage 1458 and second storage 1458'. Thus, first compute module 1454 may be isolated from communication with the second storage 1458', and the second compute module 1454' may be isolated from communication with the first storage 1458. Thus, the backplane 1400 supports bidirectional and directional communications. A storage module 1455 may communicate directly or indirectly with either compute module 1454, 1454', in either direction. However, it may be desirable for one of the servers 1454, 1454' to be prevented from seeing/connecting with the other. Such communication arrangements may be supported passively by the mechanical couplings/traces in the backplane 1400, by choosing not to route those particular traces on the backplane 1400. Alternatively, all couplings may be placed to allow connections to all interfaces, and the backplane 1400 may include active switching to open selected couplings to enforce various zoning between interfaces and/or first/second portions of an interface. Thus, the backplane 1400 allows modules to be inserted/removed, without a need to pull or install cables, and zoning software can configure modules to communicate with each other, or hardware configurations may be used (e.g., set a jumper at build-time), to provide a positive communication technique of determining module identity in connections, or whether a connection is allowed/disallowed.

Figure 15:
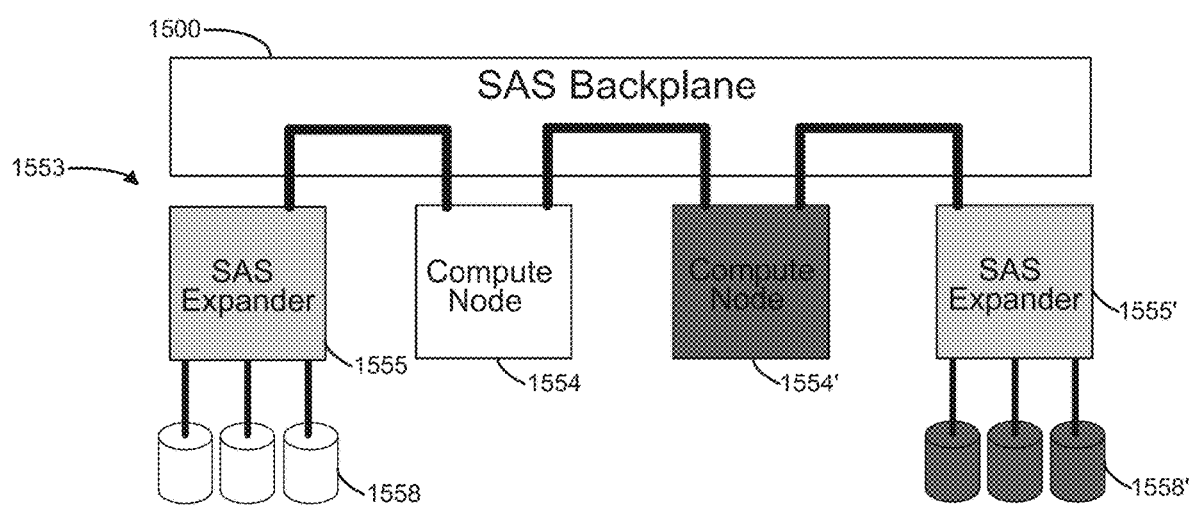
FIG. 15 is a block diagram of a backplane including an arrangement of modules and storage interfaced with the backplane.

FIG. 15 is a block diagram of a backplane 1500 including an arrangement of modules 1553 and storage 1558, 1558' interfaced with the backplane 1500. The backplane 1500 is to provide interconnections between the modules 1553, which include compute modules 1554, 1554', and storage modules 1555, 1555'.

The backplane 1500 enables a cascaded daisy chain arrangement, where communications may be passed along the backplane 1500 from one module 1553 to the next. In this example, first compute module 1554 is associated with first storage 1558 at first expander module 1555. Second compute module 1554' is associated with second storage 1558' at second storage module 1555'. Accordingly, the backplane 1500 enables communications to be isolated, such that the first compute module 1554 may be blocked from seeing the second storage module 1555' and second storage 1558'. Similarly, the backplane 1500 enables the second compute module 1554' to be blocked from seeing the first storage module 1555 and first storage 1558. However, the backplane 1500 includes physical couplings for all of the nodes, and enables communications to be propagated to all nodes (e.g., zoning/management communications may be cascaded to every node) as desired.

Figure 16:
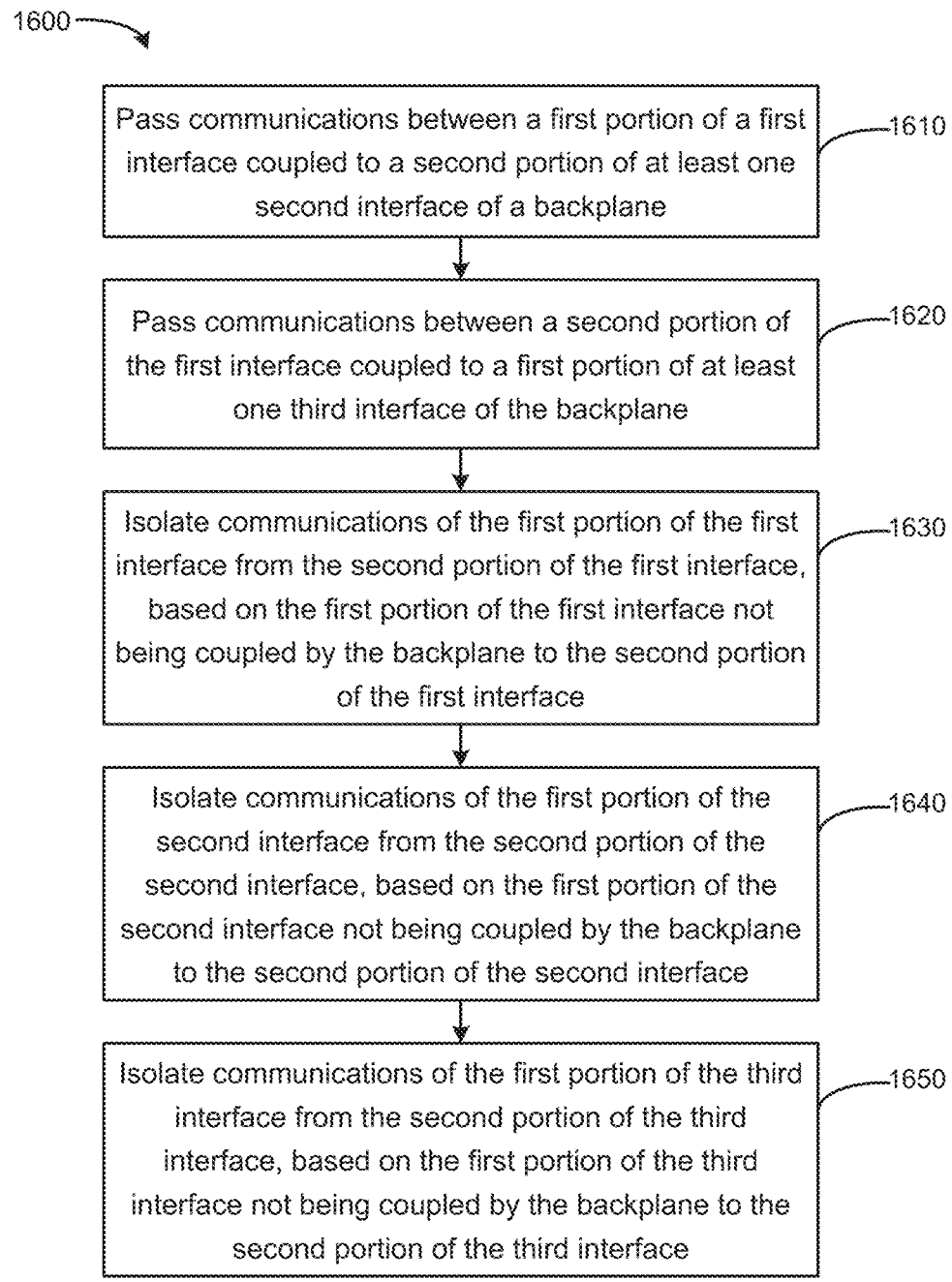
FIG. 16 is a flow chart based on communicating between interfaces of a backplane according to an example.
Figure 17:
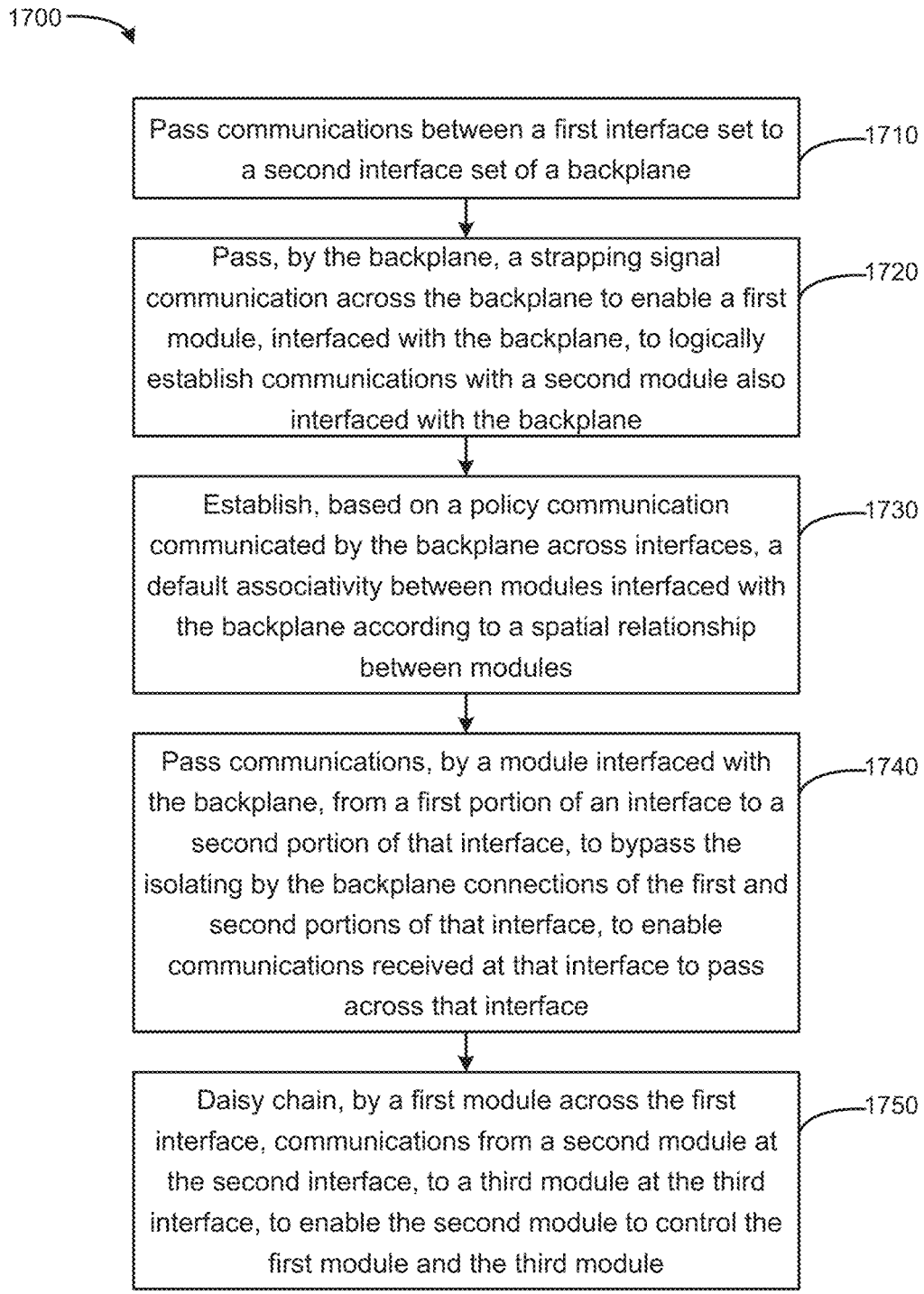
FIG. 17 is a flow chart based on communicating between interfaces of a backplane according to an example.

Referring to FIGS. 16 and 17, flow diagrams are illustrated in accordance with various examples of the present disclosure. The flow diagrams represent processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 16 is a flow chart 1600 based on communicating between interfaces of a backplane according to an example. In block 1610, communications are passed between a first portion of a first interface coupled to a second portion of at least one second interface of a backplane. For example, an interface may be formed by a single connector, and a portion of the connector's communication pins at an interface may be coupled to another portion of interface pins at another interface. In block 1620, communications are passed between a second portion of the first interface coupled to a first portion of at least one third interface of the backplane. For example, remaining pins at the connector may be coupled to another portion of another interface. In block 1630, communications of the first portion of the first interface are isolated from the second portion of the first interface, based on the first portion of the first interface not being coupled by the backplane to the second portion of the first interface. For example, the connector may have a first portion of pins that are physically isolated from a second portion of the pins. Alternatively, an interface may be formed by a plurality of discrete connectors isolated from each other by the interface couplings. In an example, the physically isolated pins/connectors may be selectively connectable based on active (e.g., electronic) switching in the backplane. In block 1640, communications of the first portion of the second interface are isolated from the second portion of the second interface, based on the first portion of the second interface not being coupled by the backplane to the second portion of the second interface. For example, the passive physical couplings (e.g., tracings) may be isolated from each other by the backplane, and connectable to a removable module that may be interfaced with the backplane. A module may couple a first portion of the interface to a second portion of the interface thereby bypassing the isolation, and similarly may couple a first interface to a second interface. In block 1650, communications of the first portion of the third interface are isolated from the second portion of the third interface, based on the first portion of the third interface not being coupled by the backplane to the second portion of the third interface. In an example, the isolation between portions may be bypassed by insertion of a module at that interface. Additionally, isolation between different portions of different interfaces may be bypassed by insertion of a module that spans across multiple interfaces.

FIG. 17 is a flow chart 1700 based on communicating between interfaces of a backplane according to an example. In block 1710, communications are passed between a first interface set to a second interface set of a backplane. For example, the backplane may include an arbitrary number of interface sets, and the interface sets may overlap or include an arbitrary number of directly connected interfaces. In block 1720, a strapping signal communication is passed, by the backplane, across the backplane to enable a first module, interfaced with the backplane, to logically establish communications with a second module also interfaced with the backplane. For example, a backplane may receive a module, and insertion of the module at the backplane interface may trigger exchange of strapping signals between the modules, to establish a default inter-module communication arrangement. In block 1730, a default associativity between modules interfaced with the backplane is established, based on a policy communication communicated by the backplane across interfaces, according to a spatial relationship between modules. For example, a cascade backplane may default to coupling communications of a module with the neighbor module to its right. In block 1740, communications, by a module interfaced with the backplane, are passed from a first portion of an interface to a second portion of that interface, to bypass the isolating by the backplane connections of the first and second portions of that interface, to enable communications received at that interface to pass across that interface. For example, a cascade backplane may pass communications across modules that are interfaced with the backplane, thereby daisy chaining communications from one node to the next. A module may have a repeater or other controller/chip to boost signals passed across it via the first/second portions of the interface(s) to which it is coupled at the backplane. In block 1750, communications from a second module at the second interface are daisy chained, by a first module across the first interface, to a third module at the third interface, to enable the second module to control the first module and the third module. For example, a cascade backplane may enable communications from one module to be propagated to an arbitrary number of other modules. Zoning configuration information may enable each module to selectively ignore or obey commands from a module.

Examples provided herein may be implemented in hardware, software, or a combination of both. Example systems, e.g., a device including a backplane and chassis, can include a processor and memory resources for executing instructions stored in a tangible non-transitory medium (e.g., volatile memory, non-volatile memory, and/or computer readable media). Non-transitory computer-readable medium can be tangible and have computer-readable instructions stored thereon that are executable by a processor to implement examples according to the present disclosure, such as the method blocks of FIGS. 16 and 17. The software implementations, such as a zoning/enclosure manager, may be bundled with the hardware, which may be interfaced (e.g., via a web interface) for definable zoning configuration.

An example system (e.g., a computing device and backplane/chassis) can include and/or receive a tangible non-transitory computer-readable medium storing a set of computer-readable instructions (e.g., software). As used herein, the processor can include one or a plurality of processors such as in a parallel processing system. The memory can include memory addressable by the processor for execution of computer readable instructions. The computer readable medium can include volatile and/or non-volatile memory such as a random access memory ("RAM"), magnetic memory such as a hard disk, floppy disk, and/or tape memory, a solid state drive ("SSD"), flash memory, phase change memory, and so on.

What is claimed is:

1. A chassis for providing cable-less coupling among a number of servers and storage modules installed in the chassis, the chassis comprising:
 a backplane, wherein the backplane is installed with the chassis, and wherein the backplane comprises:
  an interface set, comprising:
   a first interface for coupling the backplane to a first server or storage module, wherein the first interface comprises a first portion of the first interface and a second portion of the first interface,
   a second interface for coupling the backplane to second server or storage module, wherein the second interface comprises a first portion of the second interface and a second portion of the second interface, and
   a third interface for coupling the backplane to third server or storage modules, wherein the third interface comprises a first portion of the third interface and a second portion of the third interface;
   wherein the first portion of the first interface is directly coupled to the second portion of the second interface by a first cable-less coupling completely residing on the backplane,
   wherein the second portion of the first interface is directly coupled to the first portion of the third interface by a second cable-less coupling completely residing on the backplane, and
   wherein the first portion of the first interface is isolated from the second portion of the first interface, the first portion of the second interface is isolated from the second portion of the second interface, and the first portion of the third interface is isolated from the second portion of the third interface.

2. The chassis of claim 1, wherein the interface set includes a plurality of overlapping interfaces to provide a cascade of interfaces, wherein a fourth interface of interface set n overlaps with a fifth interface of interface set n+1.

3. The chassis of claim 1, wherein the interface set includes a plurality of x second interfaces whose respective second portions are directly connected to the first portion of the first interface of that interface set, and a plurality of y third interfaces whose respective first portions are directly connected to the second portion of the first interface of that interface set.

4. The chassis of claim 3, wherein the interface set is symmetrical based on a number of the plurality of x second interfaces being equal to a number of the plurality of y third interfaces.

5. The chassis of claim 3, wherein the backplane includes a plurality of interface sets having no interface overlap between the plurality of y third interfaces of interface set n, and the plurality of x second interfaces of interface set n+1.

6. The chassis of claim 1, wherein coupling of the at least one interface set provides communication lanes to enable a point-to-point routable storage fabric based on at least one of the following techniques: single-ended signaling, differential signaling, and optical signaling.

7. The chassis of claim 1, wherein the first interface, the second interface and the third interface are each logical connectors having pins/contacts to releasably connect to a computer/storage module/blade and being interfaced to other modules/blades by the backplane.

8. The chassis of claim 1, further comprising:
 a SAS expander, wherein the SAS expander is coupled to the backplane.

9. The chassis of claim 8, wherein the SAS expander is configured to block communications between portions of the interface set.

10. The chassis of claim 1, wherein the backplane further comprises mechanical couplings or tracings to mechanically route communications.

11. The chassis of claim 1, wherein the backplane is configured to:
 identify an available slot in the chassis; and
 manipulate a backplane driver or controller of the interface set to bypass the available slot in the chassis when transmitting communications within the interface set.

12. A device comprising:
 a chassis having a plurality of slots, wherein a slot is to receive a set of server or storage modules; and
 a backplane, wherein the backplane is installed with the chassis, and wherein the backplane comprising an interface set, comprising:
  a first interface for coupling the backplane to a first server or storage module of the set of server or storage modules, wherein the first interface comprises a first portion of the first interface and a second portion of the first interface, a second interface for coupling the backplane to a second server or storage module of the set of server or storage modules, wherein the second interface comprises a first portion of the second interface and a second portion of the second interface, and a third interface for coupling the backplane to a third server or storage modules of the set of server or storage modules, wherein the third interface comprises a first portion of the third interface and a second portion of the third interface;

wherein the first portion of the first interface is coupled to a second portion of the second portion of the second interface by a first cable-less coupling completely residing on the backplane;

wherein the second portion of the first interface is coupled to the first portion of the third interface; and wherein the first portion of the first interface is isolated from the second portion of the first interface, the first portion of the second interface is isolated from the second portion of the second interface, and the first portion of the third interface is isolated from the second portion of the third interface.

13. The device of claim 12, wherein the interface set includes a plurality of overlapping interfaces to provide a cascade of interfaces, wherein a fourth third interface of interface set n overlaps with a fifth interface of interface set n+1.

14. The device of claim 12, wherein the interface set includes a plurality of x second interfaces whose respective second portions are directly connected to the first portion of the first interface of that interface set, and a plurality of y third interfaces whose respective first portions are directly connected to the second portion of the first interface of that interface set.

15. The device of claim 14, wherein the interface set is symmetrical based on a number of the plurality of x second interfaces being equal to a number of the plurality of y third interfaces.

16. The device of claim 14, wherein the backplane includes a plurality of interface sets having no interface overlap between the plurality of y third interfaces of interface set n, and the plurality of x second interfaces of interface set n+1.

17. A method for providing cable-less coupling among a number of servers and storage modules installed in a chassis via a backplane of the chassis, the method comprising:

passing a first communication between an interface set, wherein the interface set comprises:

a first interface for coupling the backplane to a first server or storage module, wherein the first interface comprises a first portion of the first interface and a second portion of the first interface, a second interface for coupling the backplane to second server or storage module, wherein the second interface comprises a first portion of the second interface and a second portion of the second interface, and a third interface for coupling the backplane to third server or storage modules, wherein the third interface comprises a first portion of the third interface and a second portion of the third interface, wherein the first communication is passed through the first portion of the first interface to the second portion of a second interface via a first cable-less coupling completely residing on the backplane;

passing a second communication between the second portion of the first interface to the first portion of the third interface via a second cable-less coupling completely residing on the backplane; and isolating the first communication and the second communication based on the first portion of the first interface not being coupled by the backplane to the second portion of the first interface, based on the first portion of the second interface not being coupled by the backplane to the second portion of the second interface, and based on the first portion of the third interface not being coupled by the backplane to the second portion of the third interface.

18. The method of claim 17, further comprising passing, by the backplane, a strapping signal communication across the backplane to enable the first server or storage module, interfaced with the backplane, to logically establish communications with a second server or storage module also interfaced with the backplane.

19. The method of claim 17, further comprising establishing, based on a policy communication communicated by the backplane across interfaces, a default associativity between the first, second, or third server or storage modules interfaced with the backplane according to a spatial relationship between the first, second, or third server or storage modules.

20. The method of claim 17, further comprising daisy chaining, by the first server or storage module across the first interface, communications from the second server or storage module at the second interface, to the third server or storage module at the third interface, to enable the second server or storage module to control the first server or storage module and the third server or storage module.

* * * * *